United States Patent
Goto

(10) Patent No.: US 9,544,059 B2
(45) Date of Patent: Jan. 10, 2017

(54) OPTICAL MODULE, OPTICAL TRANSCEIVER, PRINTED CIRCUIT BOARD, AND FLEXIBLE PRINTED CIRCUIT BOARD

(71) Applicant: Oclaro Japan, Inc., Kanagawa (JP)

(72) Inventor: Fumitoshi Goto, Kanagawa (JP)

(73) Assignee: OCLARO JAPAN, INC., Kanagawa (JP)

(*) Notice: Subject to any disclaimer, the term of this patent is extended or adjusted under 35 U.S.C. 154(b) by 0 days.

(21) Appl. No.: 14/868,434

(22) Filed: Sep. 29, 2015

(65) Prior Publication Data

US 2016/0095211 A1 Mar. 31, 2016

(30) Foreign Application Priority Data

Sep. 30, 2014 (JP) ................. 2014-202188

(51) Int. Cl.
*H04B 10/40* (2013.01)
*H05K 1/02* (2006.01)
*H05K 1/11* (2006.01)
*H05K 3/36* (2006.01)

(52) U.S. Cl.
CPC ............ *H04B 10/40* (2013.01); *H05K 1/0251* (2013.01); *H05K 1/0274* (2013.01); *H05K 1/115* (2013.01); *H05K 3/363* (2013.01); *H05K 2201/09618* (2013.01); *H05K 2201/09727* (2013.01)

(58) Field of Classification Search
CPC ... H04B 10/40; H04B 10/801; H04B 10/1143; G02B 6/4246; G02B 6/4292; H05K 1/0251; H05K 3/363; H05K 2201/09618; H05K 2201/09727

See application file for complete search history.

(56) References Cited

U.S. PATENT DOCUMENTS

2004/0264882 A1* 12/2004 Torigoe ................ G02B 6/4201
385/88
2012/0229998 A1* 9/2012 Kagaya .................... H01P 1/02
361/777

FOREIGN PATENT DOCUMENTS

JP 2009-094390 A 4/2009

* cited by examiner

*Primary Examiner* — Ted Wang
(74) *Attorney, Agent, or Firm* — Mattingly & Malur, PC

(57) ABSTRACT

An optical module includes: a first circuit board including a first signal terminal part and a first ground terminal part formed on a front surface; and a second circuit board including a second signal terminal part and a second ground terminal part formed on a back surface. The first circuit board further includes: a first dielectric layer; a first signal wire formed on a front surface of the first dielectric layer; a first ground conductor layer formed on a back surface of the first dielectric layer; and a first through ground conductor passing through the first dielectric layer. The first ground terminal part is formed, in a first region and a second region respectively located on both sides of the first signal terminal part in a first direction, and in a third region prescribed at a location beyond the first signal terminal part in a second direction.

15 Claims, 28 Drawing Sheets

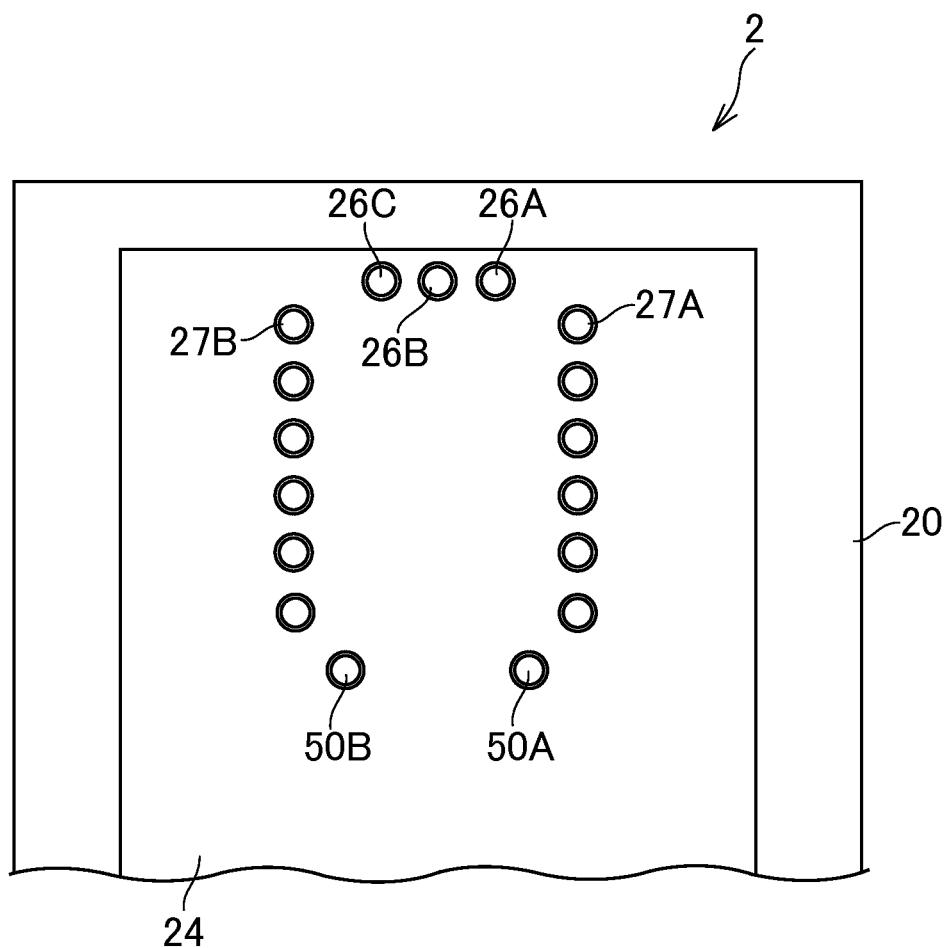

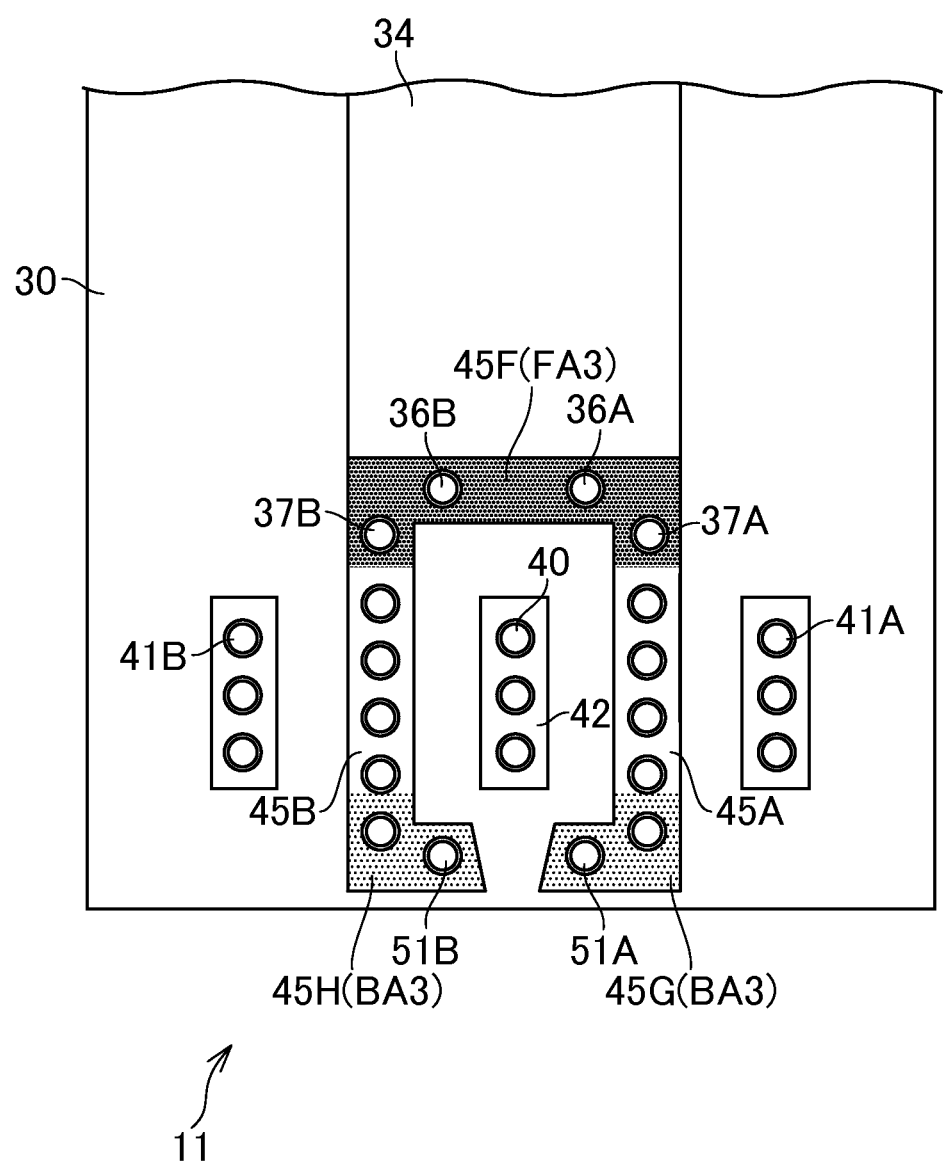

PRIOR ART

PRIOR ART

PRIOR ART

OPTICAL MODULE, OPTICAL TRANSCEIVER, PRINTED CIRCUIT BOARD, AND FLEXIBLE PRINTED CIRCUIT BOARD

CROSS-REFERENCE TO RELATED APPLICATION

The present application claims priority from Japanese application JP 2014-202188 filed on Sep. 30, 2014, the content of which is hereby incorporated by reference into this application.

BACKGROUND OF THE INVENTION

1. Field of the Invention

The present invention relates to an optical module, an optical transceiver, a printed circuit board, and a flexible printed circuit board.

2. Description of the Related Art

An optical module includes optical high frequency components. A high frequency electrical signal is input to and/or output from the optical high frequency component. Therefore, the high frequency electrical signal input to the optical high frequency component, and the high frequency electrical signal output from the optical high frequency component propagate through a transmission line. At a connection position between the transmission lines, two circuit boards are connected to each other in an overlapping manner. Out of the two circuit boards, a circuit board located on a lower side is referred to as "first circuit board", and a circuit board located on an upper side is referred to as "second circuit board". For example, such a case that an optical high frequency component and a circuit board are connected to each other via a wiring circuit board is now considered. The circuit board such as a printed circuit board is the first circuit board, and the wiring circuit board such as a flexible printed circuit board is the second circuit board.

On the first circuit board, for example, a microstrip line is formed in order to transmit a high frequency electrical signal, and further, a first terminal part connected to one end part of the microstrip line is formed on a front surface of the first circuit board. On this occasion, the microstrip line is a transmission line for transmitting the high frequency electrical signal, and is formed in a manner that a ground conductor layer having a ground electrical potential is formed on a back surface of a dielectric layer, and a signal wire pattern having a line shape is formed on a front surface of the dielectric layer. Moreover, on the second circuit board, a second terminal part to be connected to the first terminal part is formed on a back surface of the second circuit board. Both the first terminal part and the second terminal part include a ground terminal and a signal terminal. The first terminal part and the second terminal part are physically in contact with (overlap) and connected to each other via a conductive bonding material such as solder. Note that, in Japanese Patent Application Laid-open No. 2009-94390, there is disclosed an optical module in which a flexible printed circuit is appropriately constructed so that a resonance frequency component of a circuit board for transmitting a high frequency is excluded from a used bandwidth.

SUMMARY OF THE INVENTION

FIG. 15A and FIG. 15B are respectively a plan view and a bottom view of an end part of a first circuit board (such as a printed circuit board) according to the related art. FIG. 15A is a view for illustrating a front surface (top surface) of the first circuit board, and FIG. 15B is a view for illustrating a back surface (bottom surface) of the first circuit board. FIG. 16A and FIG. 16B are respectively a plan view and a bottom view of an end part of a second circuit board (such as a flexible printed circuit) according to the related art. FIG. 16A is a view for illustrating a front surface (top surface) of the second circuit board, and FIG. 16B is a view for illustrating a back surface (bottom surface) of the second circuit board. The first circuit board includes a first dielectric layer 120. On the front surface (FIG. 15A) of the first dielectric layer 120, there are formed a first signal terminal 121 connected to a first signal wire 122 via a transition part 123, first ground terminals 125A and 125B respectively arranged on both sides of the first signal terminal 121, and first DC voltage terminals 128A and 128B further respectively arranged on both sides of the first signal terminal 121. To the first DC voltage terminals 128A and 128B, DC voltage wires 129A and 129B are respectively connected. On the back surface (FIG. 15B) of the first dielectric layer 120, a first ground conductor layer 124 is formed. The first ground conductor layer 124 and the first ground terminals 125A and 125B are respectively electrically connected to each other via a plurality of via holes 127A and 127B.

The second printed circuit board includes a second dielectric layer 130. On the back surface (FIG. 16B) of the second dielectric layer 130, there are formed a second signal terminal 142 overlapping and connected to the first signal terminal 121, second ground terminals 145A and 145B respectively overlapping and connected to the first ground terminals 125A and 125B, and second DC voltage terminals 148A and 148B respectively overlapping and connected to the first DC voltage terminals 128A and 128B. Further, on the back surface of the second dielectric layer 130, a second ground conductor layer 134 is formed and connected to the second ground terminals 145A and 145B. On the front surface (FIG. 16A) of the second dielectric layer 130, there are formed a third signal terminal 131 connected to a second signal wire 132 via a transition part 133, third ground terminals 135A and 135B respectively arranged on both sides of the third signal terminal 131, and third DC voltage terminals 138A and 138B further respectively arranged on both sides of the third signal terminal 131. To the third DC voltage terminals 138A and 138B, DC voltage wires 139A and 139B are respectively connected. The second signal terminal 142 and the third signal terminal 131 are electrically connected to each other via a plurality of via holes 140. The second ground terminals 145A and 145B and the third ground terminals 135A and 135B are respectively electrically connected to each other via a plurality of via holes 137A and 137B. The second DC voltage terminals 148A and 148B and the third DC voltage terminals 138A and 138B are respectively electrically connected to each other via a plurality of via holes 141A and 141B.

In general, a high frequency electrical signal is reflected or radiated at a connection position between transmission lines, and signal degradation occurs in the electrical signal propagating in an optical module. However, in the optical module, optical high frequency components need to be mounted on a printed circuit, and the optical high frequency components need to be connected via a wiring circuit board, and hence the connection between the transmission lines is necessary. In the field of the optical communication and the like, an increase in transmission speed in the optical module is desired, and the inventors of the present invention diligently have investigated a cause for the signal degradation. As a result, the inventors of the present invention have acquired such knowledge that, in order to further reduce the signal degradation to increase a high frequency characteristic, the reflection and the radiation of the high frequency electrical signals at the connection position between the transmission lines need to be further reduced.

The present invention has been made in view of the above-mentioned problem, and has an object to provide an optical module, an optical transceiver module, a printed circuit board, and a flexible printed circuit board for reducing reflection and radiation at a connection position between transmission lines, to thereby reduce signal degradation of an electrical signal to be transmitted.

(1) In order to solve the above-mentioned problem, an optical module according to one embodiment of the present invention includes: a first circuit board including a first signal terminal part and a first ground terminal part, which are formed on a front surface of the first circuit board; and a second circuit board including a second signal terminal part and a second ground terminal part, which are respectively connected to the first signal terminal part and the first ground terminal part in an overlapping manner, and are formed on a back surface of the second circuit board. The first circuit board further includes: a first dielectric layer; a first signal wire formed on a front surface of the first dielectric layer, and electrically connected to the first signal terminal part; a first ground conductor layer formed on a back surface of the first dielectric layer so as to include a region opposed to the first signal wire and regions extending toward both sides of the opposed region; and a first through ground conductor, which passes through the first dielectric layer from the back surface to the front surface, and electrically connects the first ground conductor layer and the first ground terminal part to each other. The first ground terminal part is formed, in a plan view, in a first region and a second region respectively located on both opposing sides of the first signal terminal part in a first direction, and in a third region prescribed at a location beyond the first signal terminal part in a second direction intersecting the first direction.

(2) In the optical module according to Item (1), the regions in which the first ground terminal part is formed may include, in a plan view, a fourth region located on an opposite side of the first signal wire across the first signal terminal part out of the third region.

(3) In the optical module according to Item (1) or (2), the first ground conductor layer may be formed, in a plan view, in a region including the first ground terminal part.

(4) In the optical module according to any one of Items (1) to (3), the first through ground conductor may be formed, in a plan view, in a region in which the first ground terminal part is formed.

(5) In the optical module according to any one of Items (1) to (4), the first through ground conductor may be formed, in a plan view, in the first region, the second region, and the third region.

(6) In the optical module according to any one of Items (1) to (5), the first signal wire may be formed of a single strip conductor, and the first signal terminal part may include one terminal connected to the single strip conductor and extending in the second direction.

(7) In the optical module according to any one of Items (1) to (6), the first signal wire may be formed of a plurality of strip conductors arranged in the first direction, and the first signal terminal part may include a plurality of terminals respectively connected to the plurality of strip conductors, arranged in the first direction, and each extending in the second direction.

(8) In the optical module according to Item (6) or (7), the first ground terminal part may include, in a plan view, parts extending in the second direction respectively on both sides of the first signal terminal part in the first direction, and a part extending in the first direction in the third region.

(9) In the optical module according to any one of Items (1) to (8), the second circuit board may further include: a second dielectric layer; a second signal wire formed on a front surface of the second dielectric layer, and electrically connected to the second signal terminal part; a second ground conductor layer formed on a back surface of the second dielectric layer so as to include a region opposed to the second signal wire and regions extending toward both sides of the opposed region, the second ground conductor layer being electrically connected to the second ground terminal part; and a second through ground conductor, which passes through the second dielectric layer from the back surface to the front surface, and is electrically connected to the second ground terminal part, and the second ground terminal part may be formed, in a plan view, in the first region, the second region, and the third region.

(10) In the optical module according to Item (9), the regions in which the second ground terminal part is formed may include, in a plan view, the fourth region out of the third region.

(11) An optical module according to one embodiment of the present invention may include: a first circuit board including a first signal terminal part and a first ground terminal part, which are formed on a front surface of the first circuit board; and a second circuit board including: a second signal terminal part and a second ground terminal part, which are respectively connected to the first signal terminal part and the first ground terminal part in an overlapping manner, and are formed on a back surface of the second circuit board; a second dielectric layer; a second signal wire formed on a front surface of the second dielectric layer, and electrically connected to the second signal terminal part; a second ground conductor layer formed on a back surface of the second dielectric layer so as to include a region opposed to the second signal wire and regions extending toward both sides of the opposed region, the second ground conductor layer being electrically connected to the second ground terminal part; and a second through ground conductor, which passes through the second dielectric layer from the back surface to the front surface, and is electrically connected to the second ground terminal part. The second ground terminal part may be formed, in a plan view, in a first region and a second region respectively located on both opposing sides of the second signal terminal part in a first direction, and in a third region prescribed at a location beyond the second signal terminal part in a second direction intersecting the first direction.

(12) In the optical module according to Item (11), the regions in which the second ground terminal part is formed may include, in a plan view, a fifth region located on an opposite side of the second signal wire across the second signal terminal part out of the third region.

(13) An optical transceiver module according to one embodiment of the present invention may include: the optical module according to any one of Items (1) to (12); and another optical module. One of the optical module and the another optical module may serve as an optical transmitter, and another one of the optical module and the another optical module may serve as an optical receiver.

(14) A printed circuit board according to one embodiment of the present invention may include: a first signal terminal part and a first ground terminal part, which are formed on a front surface of the printed circuit board, and are respectively connected to a second signal terminal part and a second ground terminal part, which are formed on a back surface of another circuit board, in an overlapping manner; a first dielectric layer; a first signal wire formed on a front surface of the first dielectric layer, and electrically connected to the first signal terminal part; a first ground conductor layer formed on a back surface of the first dielectric layer so as to include a region opposed to the first signal wire and regions extending toward both sides of the opposed region; and a first through ground conductor, which passes through the first dielectric layer from the back surface to the front surface, and electrically connects the first ground conductor layer and the first ground terminal part to each other. The first ground terminal part may be formed, in a plan view, in a first region and a second region respectively located on both opposing sides of the first signal terminal part in a first direction, and in a third region, which is prescribed at a location beyond the first signal terminal part in a second direction intersecting the first direction and is located on an opposite side of the first signal wire across the first signal terminal part.

(15) A flexible printed circuit board according to one embodiment of the present invention may include: a second signal terminal part and a second ground terminal part, which are formed on a back surface of the flexible printed circuit board, and are respectively connected to a first signal terminal part and a first ground terminal part, which are formed on a front surface of another circuit board, in an overlapping manner; a second dielectric layer; a second signal wire formed on a front surface of the second dielectric layer, and electrically connected to the second signal terminal part; a second ground conductor layer formed on a back surface of the second dielectric layer so as to include a region opposed to the second signal wire and regions extending toward both sides of the opposed region, the second ground conductor layer being electrically connected to the second ground terminal part; and a second through ground conductor, which passes through the second dielectric layer from the back surface to the front surface, and is electrically connected to the second ground terminal part. The second ground terminal part may be formed, in a plan view, in a first region and a second region respectively located on both opposing sides of the second signal terminal part in a first direction, and in a third region prescribed at a location beyond the second signal terminal part in a second direction intersecting the first direction.

According to the one embodiment of the present invention, the optical module, the optical transceiver module, the printed circuit board, and the flexible printed circuit board for reducing the reflection and radiation at the connection position, to thereby reduce the signal degradation of the electrical signal to be transmitted, are provided.

BRIEF DESCRIPTION OF THE DRAWINGS

FIG. 10B is a bottom view of the printed circuit board end part according to the third embodiment of the present invention.

FIG. 11B is a bottom view of the flexible printed circuit board end part according to the third embodiment of the present invention.

DETAILED DESCRIPTION OF THE INVENTION

Figure 1:
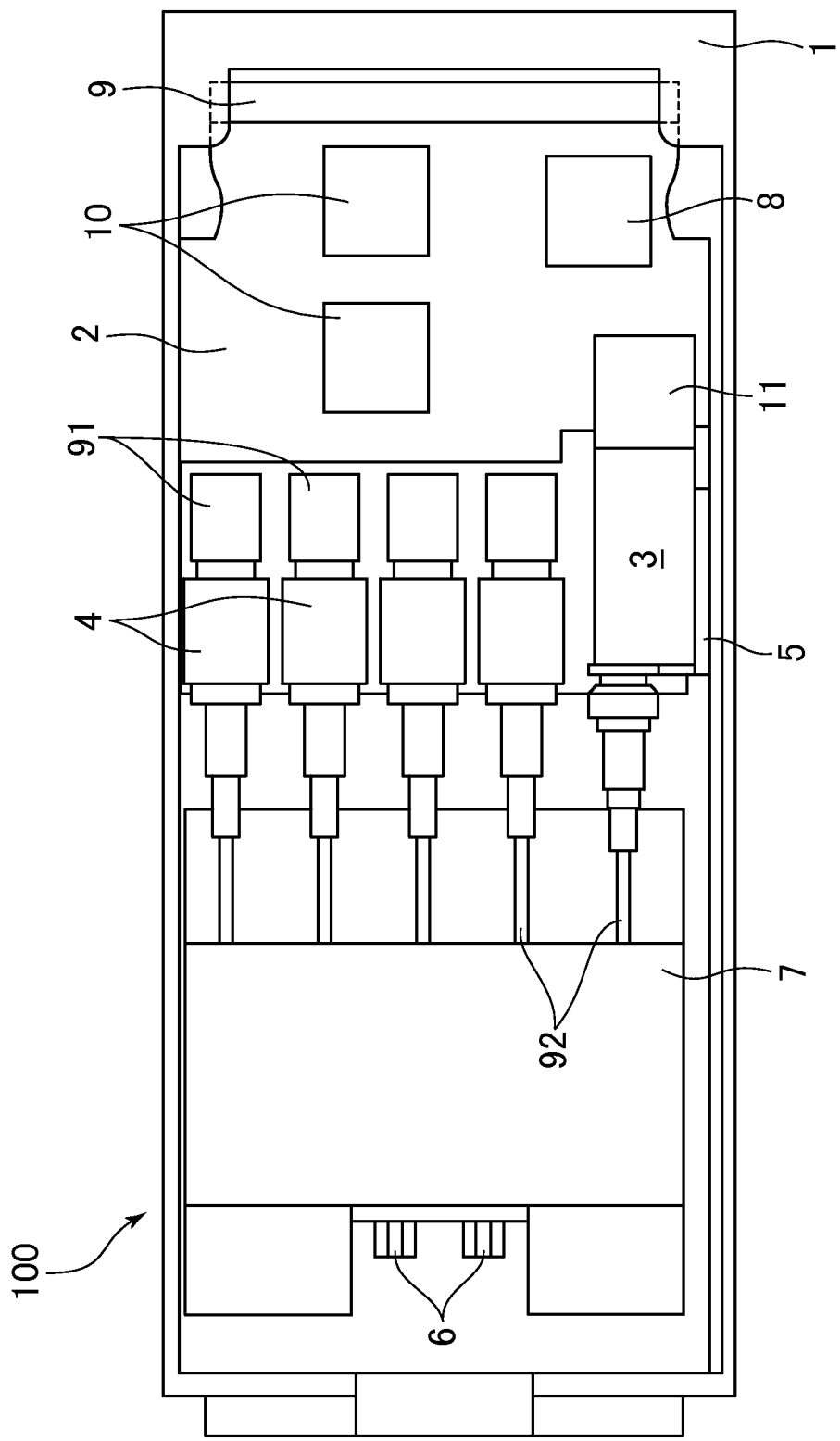
FIG. 1 is a plan view of an optical transceiver module according to a first embodiment of the present invention.

Embodiments of the present invention are specifically described in detail in the following with reference to the attached drawings. Note that, throughout the drawings for illustrating the embodiments, like reference numerals are used to represent members having like functions, and description thereof is omitted for the sake of simplicity. Note that, the drawings referred to in the following are only for illustrating the embodiments by way of examples, and are not necessarily drawn to scale.

First Embodiment

FIG. 1 is a plan view of an optical transceiver module 100 according to a first embodiment of the present invention. FIG. 1 is a view for schematically illustrating components stored inside a housing of the optical transceiver module 100. Specifically, FIG. 1 is an illustration of a state in which a top plate (plate member on a side on which an optical reception component 3, optical transmission components 4, and the like are mounted with respect to a printed circuit 2) of a housing 1 is removed. Note that, the optical transceiver module 100 according to this embodiment has exterior dimensions compliant with the CFP2 standard, but may be an optical module compliant with another standard or an optical transceiver module having an original size that is not compliant with any standard.

As illustrated in FIG. 1, a printed circuit board (PCB) 2 having a flat plate shape is fixed inside the housing 1, and the optical reception component (ROSA) 3 and the optical transmission components (TOSAs) 4, which are principal optical components, are mounted on the printed circuit board 2. Those optical components are fixed on the printed circuit board 2 by a component tray 5. Note that, the optical reception component 3 and the optical transmission components 4 are examples of the optical high frequency components.

An optical signal input from an optical receptacle 6 of the optical transceiver module 100 travels over an optical fiber 92, passes through an optical fiber tray 7 holding the optical fiber 92, and is converted into an electrical signal by the optical reception component 3. A flexible printed circuit board (FPC) 11 is connected to the optical reception component 3, and the electrical signal with a high frequency output by the optical reception component 3 propagates through a transmission line formed on the flexible printed circuit board 11. Moreover, the optical reception component 3 includes a ceramic circuit board 12 (not shown). The electrical signal output by the optical reception component 3 passes through the transmission line formed on the flexible printed circuit board 11 and the printed circuit board 2, is amplified by an electrical high frequency component 8 (amplifier), and is output to a device connected to a card edge connector 9. Note that, in the optical transceiver module 100, a region (function) from a part for optical reception of the optical receptacle 6 to which the optical signal is input to a part for optical reception of the card edge connector 9 from which the electrical signal is output, including the optical reception component 3, corresponds to an optical receiver module.

Moreover, an electrical signal input from a device connected to the card edge connector 9 of the optical transceiver module 100 is amplified by an electrical high frequency component 10 (amplifier), passes through a flexible printed circuit board 91, and is converted into an optical signal by the optical transmission component 4. The optical signal converted by the optical transmission component 4 passes through the optical fiber 92 and an optical multiplexer, and is output from the optical receptacle 6. Note that, in the optical transceiver module 100, a region (function) from a part for optical transmission of the card edge connector 9 to which the electrical signal is input to a part for optical transmission of the optical receptacle 6 from which the optical signal is output, including the optical transmission component 4, corresponds to an optical transmitter module.

One major feature of the present invention resides in a configuration of a terminal part of the printed circuit board 2 (first circuit board). Now, a description is given thereof. Note that, in the specification, the optical module refers to any one of the optical transmitter module (optical transmitter) and the optical receiver module (optical receiver). Note that, the optical transceiver module refers to a module including the optical transmitter module and the optical receiver module.

Figure 2:
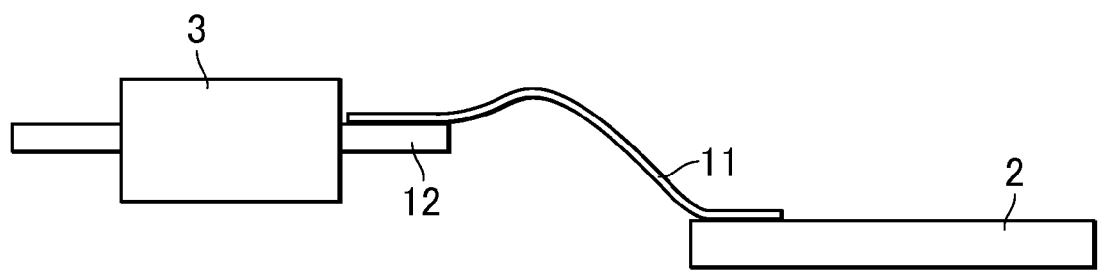
FIG. 2 is a schematic view for illustrating a connection between a printed circuit and a flexible printed circuit board according to the first embodiment of the present invention.

FIG. 2 is a schematic diagram for illustrating the connection between the printed circuit board 2 and the flexible printed circuit board 11 according to this embodiment, and is a side view of the flexible printed circuit board 11 and peripheral components thereof. As illustrated in FIG. 2, the flexible printed circuit board 11 is arranged between the optical reception component 3 and the printed circuit board 2, and one end part of the flexible printed circuit board 11 is connected to the printed circuit board 2. Moreover, the other end part of the flexible printed circuit board 11 is connected to the ceramic circuit board 12 of the optical reception component 3. Note that, the optical reception component 3 is actually fixed to the component tray 5 formed on the printed circuit board 2, but for the sake of simplicity, the optical reception component 3 and the printed circuit board 2 are illustrated as being separated from each other. Moreover, the present invention can be applied also to such a case that the optical reception component 3 (or the optical transmission component 4) is not fixed on the printed circuit board 2, and the optical reception component 3 and the printed circuit board 2 do not overlap each other.

Figure 3A:
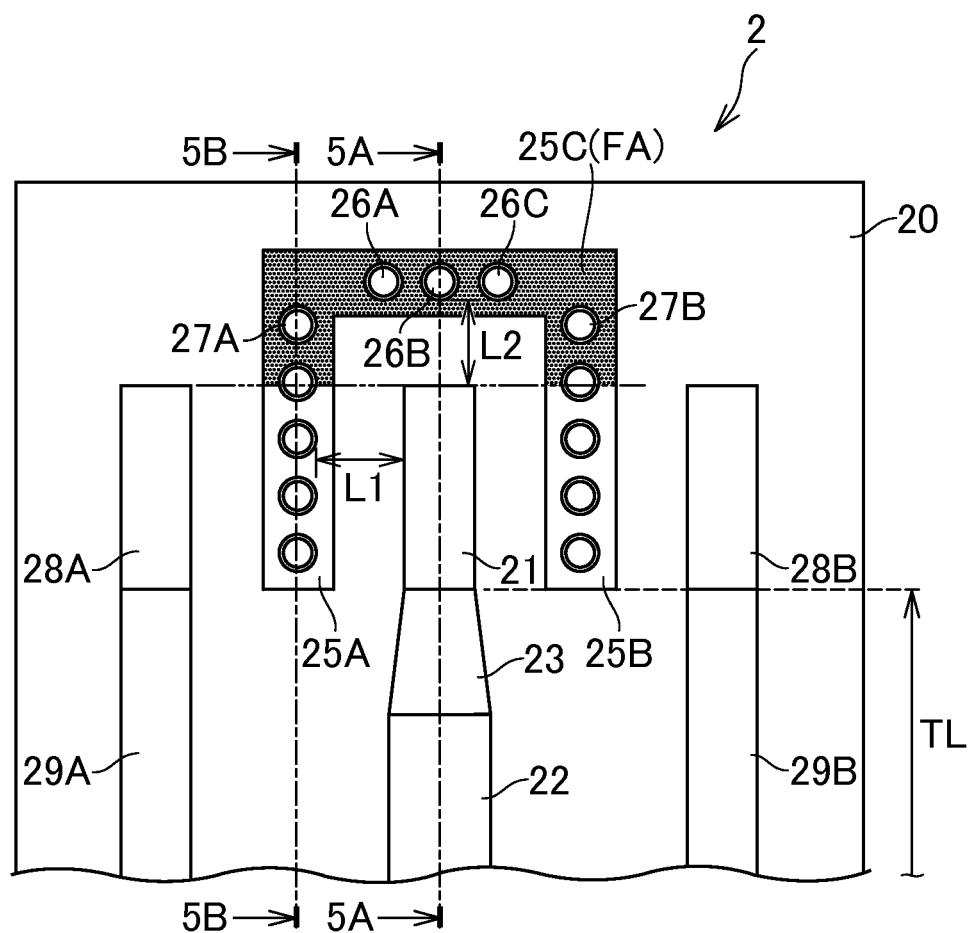
FIG. 3A is a plan view of a printed circuit board end part according to the first embodiment of the present invention.
Figure 3B:
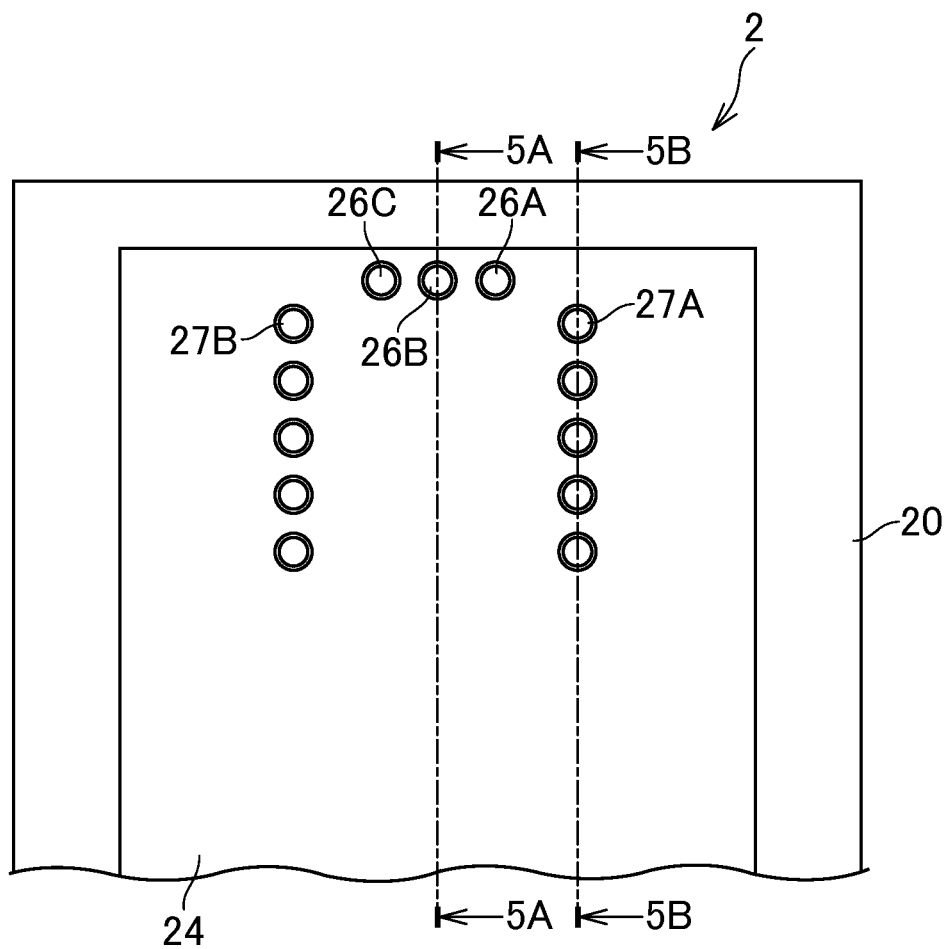
FIG. 3B is a bottom view of the printed circuit board end part according to the first embodiment of the present invention.
Figure 4A:
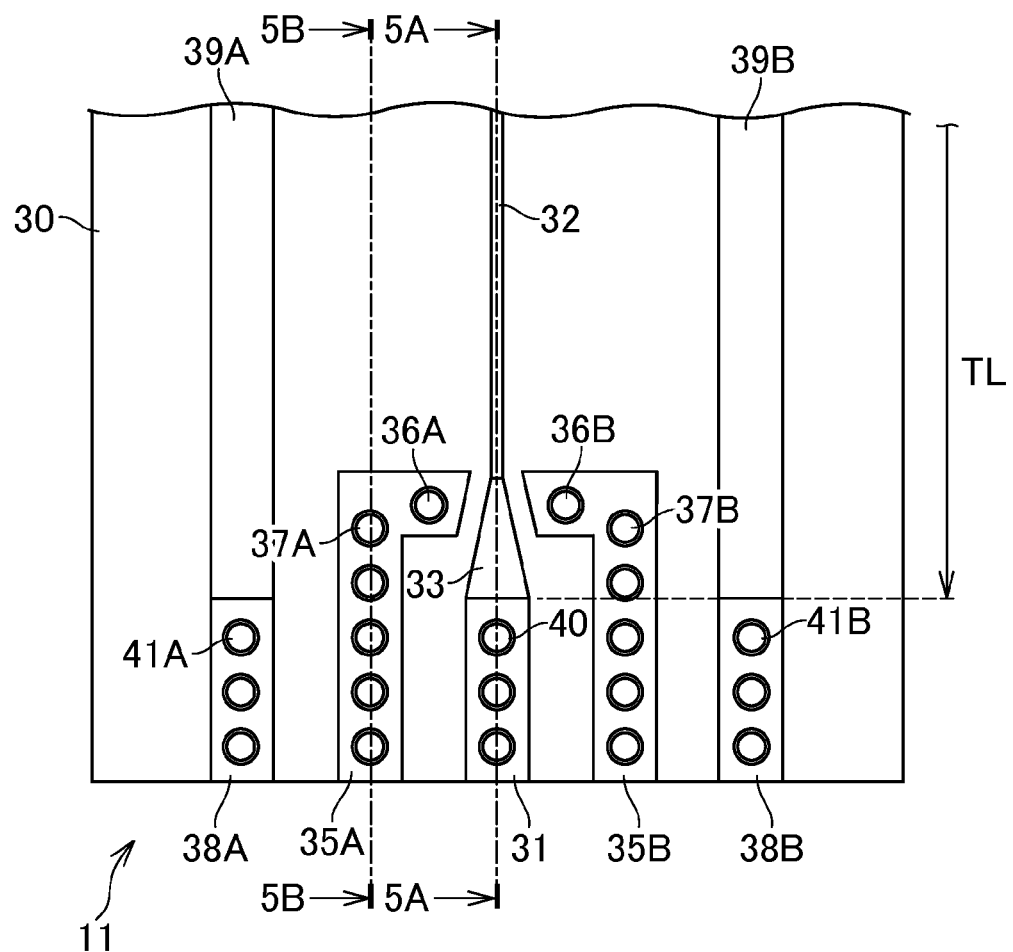
FIG. 4A is a plan view of a flexible printed circuit board end part according to the first embodiment of the present invention.
Figure 4B:
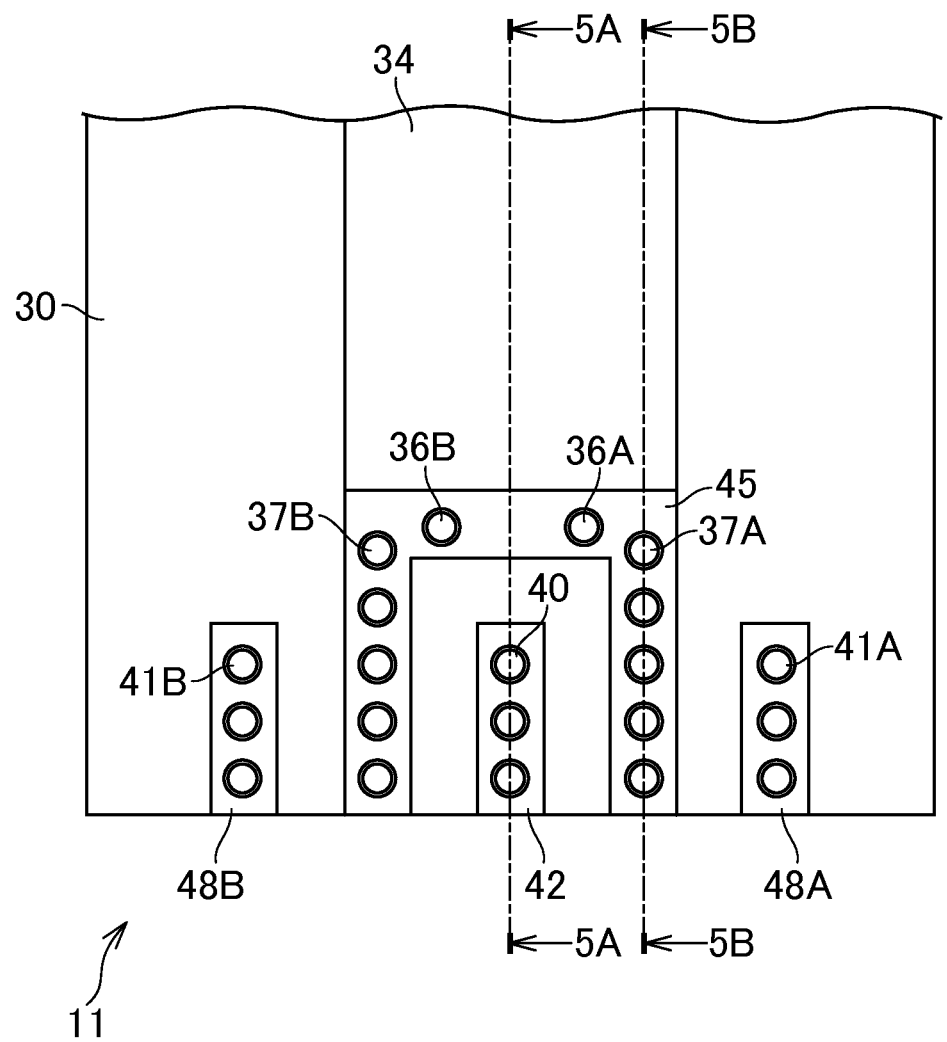
FIG. 4B is a bottom view of the flexible printed circuit board end part according to the first embodiment of the present invention.
Figure 5A:
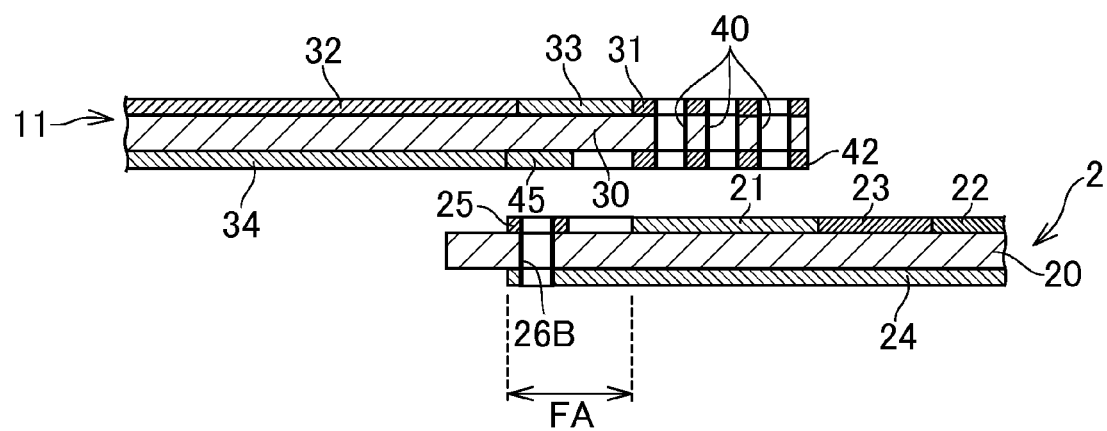
FIG. 5A is a cross sectional view for illustrating an arrangement of the printed circuit and the flexible printed circuit board according to the first embodiment of the present invention.
Figure 5B:
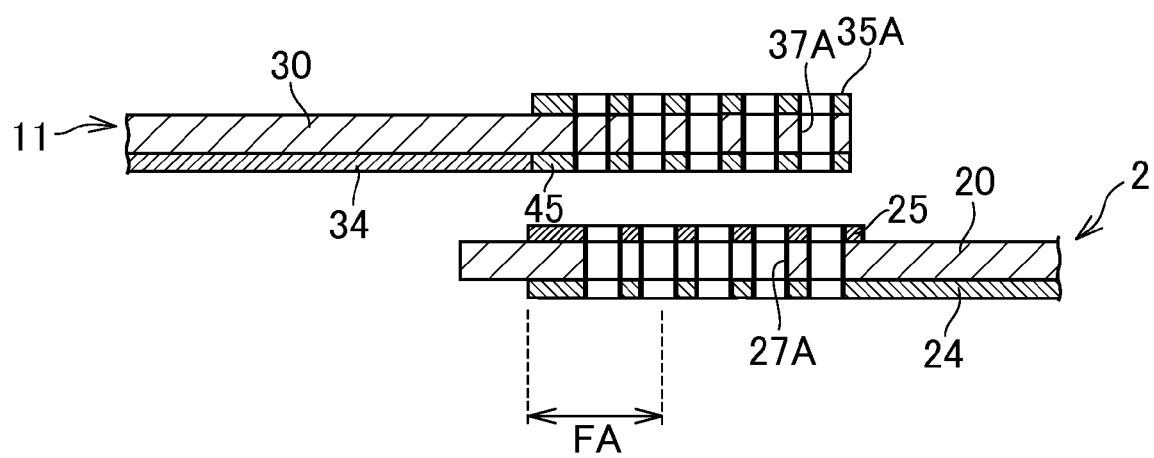
FIG. 5B is a cross sectional view for illustrating the arrangement of the printed circuit and the flexible printed circuit board according to the first embodiment of the present invention.

FIG. 3A and FIG. 3B are respectively a plan view and a bottom view of an end part of the printed circuit board 2 (first circuit board) according to this embodiment. FIG. 3A is an illustration of a front surface (top surface) of the printed circuit board 2, and FIG. 3B is an illustration of a back surface (bottom surface) of the printed circuit board 2. FIG. 4A and FIG. 4B are respectively a plan view and a bottom view of an end part of the flexible printed circuit board 11 (second circuit board) according to this embodiment. FIG. 4A is an illustration of a front surface (top surface) of the flexible printed circuit board 11, and FIG. 4B is an illustration of a back surface (bottom surface) of the flexible printed circuit board 11. FIG. 5A and FIG. 5B are cross sectional views for illustrating an arrangement of the printed circuit board 2 and the flexible printed circuit board 11 according to this embodiment. FIG. 5A is a cross sectional view taken along the line 5A-5A of FIG. 3A to FIG. 4B when viewed from the arrows, and FIG. 5B is a cross sectional view taken along the line 5B-5B of FIG. 3A to FIG. 4B when viewed from the arrows.

As illustrated in FIG. 3A, a first signal terminal part and a first ground terminal part are formed on the front surface of the printed circuit board 2. The printed circuit board 2 includes a first dielectric layer 20. The first signal terminal part is a first signal terminal 21 (one terminal) formed on a front surface of the first dielectric layer 20, and has a rectangular shape extending in a longitudinal direction (second direction). The first ground terminal part is a first ground terminal 25 (not shown) formed on the front surface of the first dielectric layer 20, and has a shape (U shape) surrounding both left and right sides and further a top side of the rectangular first signal terminal 21. The first ground terminal 25 is, as described later, constructed with three first ground terminals 25A, 25B, and 25C. A first signal wire 22 electrically connected to the first signal terminal 21 is constructed with a single strip conductor extending in the longitudinal direction (second direction) so as to have a predetermined width (first width). The first signal terminal 21 is connected to the first signal wire 22 via a transition part 23. Note that, the first signal terminal 21, the transition part 23, and the first signal wire 22 are integrally formed, and are formed by a single piece of metal foil. A width (second width) of the first signal terminal 21 is slightly narrower than the width (first width) of the first signal wire 22. The transition part 23 has the width (first width) of the first signal wire 22 at the illustrated bottom end thereof, and the width of the transition part 23 gradually narrows as the transition part 23 extends upward, and becomes as narrow as the width (second width) of the first signal terminal 21 at the illustrated top end thereof. Note that, the width (second width) of the first signal terminal 21 is slightly narrower than the width (first width) of the first signal wire 22 due to the shape taking impedance matching into account, but the shape is not limited thereto. The shape is appropriately selected depending on materials and thicknesses of the first dielectric layer and the second dielectric layer. As illustrated in FIG. 3B, a first ground conductor layer 24 is formed on a back surface of the first dielectric layer 20. The first ground conductor layer 24 is formed on the back surface of the first dielectric layer 20 so as to include a region opposed to the first signal wire 22 formed on the front surface of the first dielectric layer 20 and regions extending on both sides of the opposed region. On this occasion, the first ground conductor layer 24 is formed on the entire surface of the printed circuit board 2 except for a frame region. In other words, the first ground conductor layer 24 is formed so as to further include regions opposed to the transition part 23 and the first signal terminal part (first signal terminal 21) and regions extending on both sides of the opposed regions. A microstrip line is constructed between the first signal wire 22 (and the transition part 23) and the first ground conductor layer 24. The transmission line according to the present invention is not limited to the microstrip line, and may be constructed with a grounded coplanar line involving the ground layer. In other words, on the front surface of the first dielectric layer 20, a pair of first ground wires (not shown) may be formed, which respectively have rectangular shapes connected to the first ground terminal 25 and extending in the longitudinal direction (second direction) on both sides of the first signal wire 22. The grounded coplanar line is constructed between the pair of first ground wires and the first signal wire 22 (and the transition part 23), and the first ground conductor layer 24.

The first ground terminal 25 is electrically connected to the ground conductor layer 24 via a plurality of via holes. On this occasion, the plurality of via holes are first through ground conductors, which pass through the first dielectric layer 20 from the back surface to the front surface, and electrically connect the first ground conductor layer 24 and the first ground terminal 25 to each other. The via hole is a through hole having a metal-plated inner wall. The first ground terminal 25 only needs to be formed in a region including at least a part of the first through ground conductors, but it is desired that the first ground terminal 25 be formed in a region including (all of) the first through ground conductors in a plan view in terms of a stable connection of the ground electric potential and an improvement in characteristics as a transmission line. Moreover, similarly, it is desired that the first ground conductor layer 24 be formed in a region including (all of) the first through ground conductors. Moreover, on this occasion, in terms of securing a wider area overlapping the ground terminal part formed on the flexible printed circuit board 11, it is desired that the first ground terminal part be formed by one first ground germinal 25, but the first ground terminal part is not limited to this configuration. For example, the first ground terminal part may be constructed with a plurality of ground terminals each including a part of the shape of the first ground terminal 25 illustrated in FIG. 3A and being separated from one another.

Figure 6:
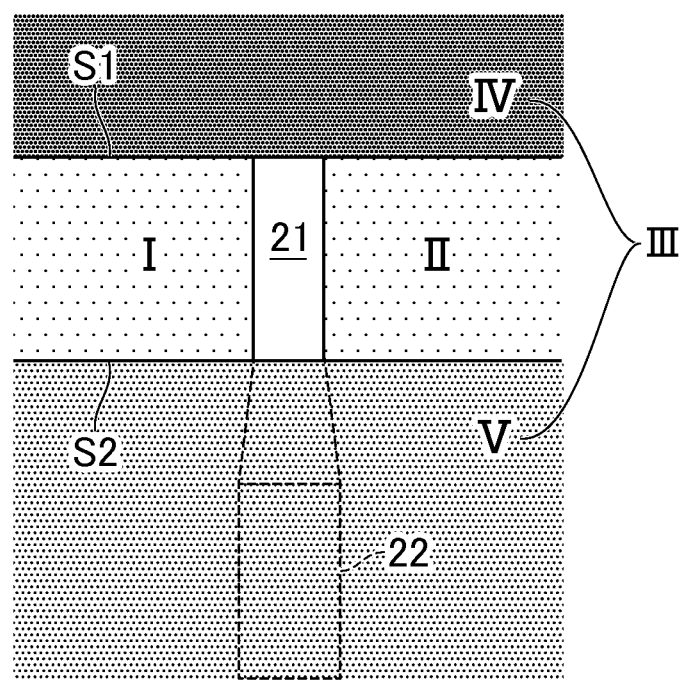
FIG. 6 is a schematic diagram for illustrating a peripheral region of a signal terminal part according to the present invention.

FIG. 6 is a schematic diagram for illustrating a peripheral region of the signal terminal part according to the present invention. In a plan view, a plurality of regions acquired by dividing the peripheral region surrounding the signal terminal part (in this case, the first signal terminal 21) are illustrated. The peripheral region surrounding the signal terminal part is divided into four regions by two straight lines S1 and S2 respectively passing through a top end and a bottom end of the signal terminal part and running straight in the lateral direction (first direction), and by the signal terminal part. Between the two straight lines S1 and S2, there are two regions located on both sides of the signal terminal part in the lateral direction (first direction) of FIG. 6. Out of the two regions, one side (left side) is a first region (region I), and the other side (right side) is a second region (region II). In a region (third region) prescribed at a location beyond the signal terminal part in the longitudinal direction (second direction intersecting the first direction) of FIG. 6, a region on an upper side of the straight line S1 is a fourth region (region IV), and a region on a lower side of the straight line S2 is a fifth region (region V). In other words, the region acquired by combining the fourth region and the fifth region is the third region (region III).

Figure 15A:
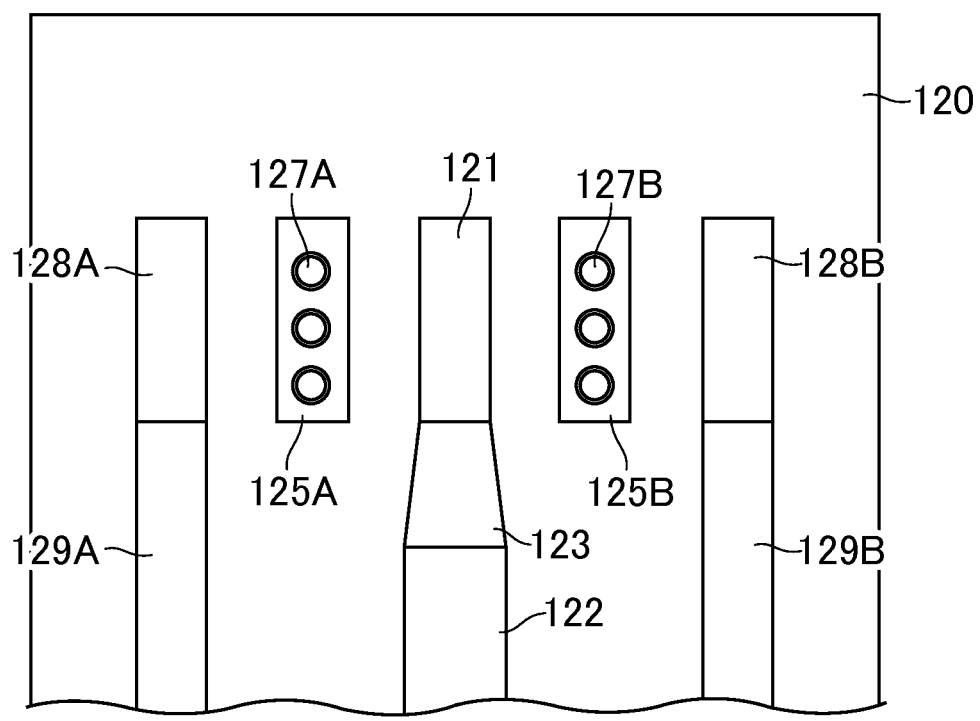
FIG. 15A is a plan view of a first printed circuit board end part according to the related art.
Figure 15B:
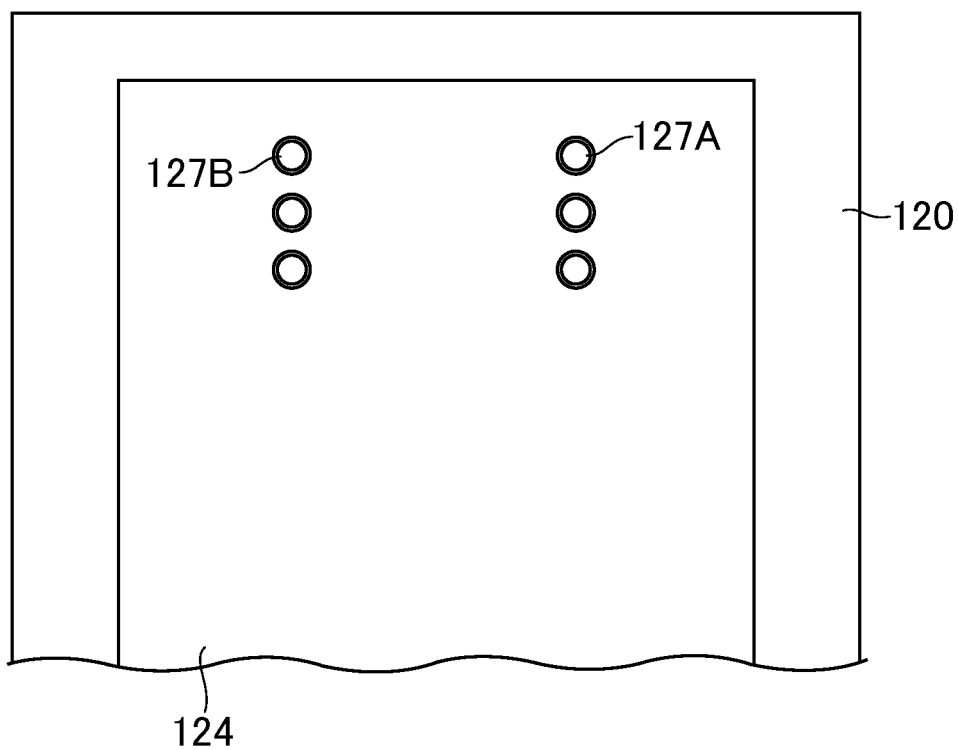
FIG. 15B is a bottom view of the first printed circuit board end part according to the related art.

As illustrated in FIG. 15A, in the terminal part of the first circuit board according to the related art, in a plan view, in a periphery of a first signal terminal 121 extending in the longitudinal direction (second direction), only first ground terminals 125A and 125B extending in the longitudinal direction (second direction) on both the left and right sides of the first signal terminal 121 exist. In other words, the ground terminal part is formed only in the first region and the second region of the signal terminal part. Moreover, in the terminal part of the first circuit board according to the related art, in a plan view, the ground conductors extending in a direction perpendicular to the drawing sheet in the periphery of the first signal terminal 121 are only via holes 127A and 127B respectively arranged on both the left and right sides of the first signal terminal 121. In other words, the ground conductors are formed only in the first region and the second region.

In contrast, as illustrated in FIG. 3A, on the printed circuit board 2 according to this embodiment, the first ground terminal part is the first ground terminal 25 constructed with the three first ground terminals 25A, 25B, and 25C. The three first ground terminals 25A, 25B, and 25C are integrally formed, and are formed by a single piece of metal foil. On this occasion, the first ground terminal 25A is formed in the first region, the first ground terminal 25B is formed in the second region, and the first ground terminal 25C is formed in the fourth region (including the shaded region FA of FIG.

3A). In other words, the region in which the first ground terminal part is formed includes (a part of) the fourth region in a plan view. Note that, as illustrated in FIG. 6, positions of both ends of the first region and the second region in the longitudinal direction (second direction) match positions of both ends of the first signal terminal 21. A description is now given of the region FA. The region FA is included in the fourth region of FIG. 6. The fourth region is the region located on the opposite side (upper side) of the first signal wire 22 (lower side of the drawing) across the first signal terminal 21, out of the region (third region) prescribed at the location beyond the first signal terminal 21 in the longitudinal direction (location not including the first signal terminal 21). Moreover, on the printed circuit board 2 according to this embodiment, the first ground terminal 25 is constructed with the first ground terminals 25A, 25B, and 25C, and thus, the plurality of via holes are formed in the fourth region in addition to the first and second regions. In other words, the region in which the plurality of via holes (first through ground conductors) are formed includes (a part of) the fourth region in a plan view.

One major feature of the first circuit board according to the present invention resides in that the first ground terminal part is formed in the first, second, and third regions around the first signal terminal part in a plan view. As a result of the formation of the first ground terminal part also in the third region, the reflection and radiation of the high frequency electrical signal generated at the connection position between the first circuit board and the second circuit board can be reduced. Even when the first ground terminal part is formed in any part of the third region in a plan view, the present invention can provide the effect. However, in the third region, it is desired that the first ground terminal part be formed in a region sandwiched by (an outside edge of) the part formed in the first region and (an outside edge of) the part formed in the second region. Moreover, in the first ground terminal part, it is desired that a gap between the part formed in the third region and the first signal terminal part in the longitudinal direction (second direction) be equal to or less than gaps between the parts formed in the first and second regions and the first signal terminal part in the lateral direction (first direction). On this occasion, the gap is a distance between one inner edge and the other inner edge.

The shape of the first ground terminal part can be selected by a designer. In the third region, the first signal wire 22 and the like are not arranged in the region (fourth region) above the top end of the first signal terminal 21, and hence the fourth region has a high degree of freedom for arranging the first ground terminal part. Thus, it is desired that the first ground terminal part be formed in at least the fourth region in the third region in a plan view. According to this embodiment, the first signal terminal 21 has a rectangular shape extending in the second direction. The first ground terminal 25 extends upward in the longitudinal direction (second direction) on both sides of the first signal terminal 21 from the illustrated bottom end so as to have a predetermined width (the extending parts include the first ground terminals 25A and 25B). Further, the first ground terminal 25 respectively bends inward above the illustrated top end of the first signal terminal 21, extends in the lateral direction so as to have in a predetermined width, and connects to each other. In other words, the first ground terminal 25 includes, in a plan view, the parts respectively extending in the longitudinal direction on both sides of the first signal terminal 21 and the part extending in the lateral direction (first direction) in the region (fourth region) above the top end of the first signal terminal 21 in the third region.

The first through ground conductors according to this embodiment include five via holes 27A, five via holes 27B, and three via holes 26A, 26B, and 26C. The via holes 27A and 27B are respectively formed in the first ground terminal 25 at the parts extending in the longitudinal direction on both sides of the first signal terminal 21. The via holes 26A, 26B, and 26C are formed in the first ground terminal 25 at the part extending in the lateral direction in the fourth region. The shape of the first ground terminal 25 can increase the number of via holes (first through ground conductors) formed in the region in which the first ground terminal 25 is formed in a plan view, resulting in an enhancement in the effect of the present invention. This is because, in a plan view, in the periphery of the first signal terminal 21, the three sides (left, right, and top sides) except for the first signal wire side (bottom side) can be surrounded by the first ground terminal 25 (and the first through ground conductors). It is desired that the gap L2 between the three via holes 26A, 26B, and 26C arranged in the lateral direction above the first signal terminal 21 and the first signal terminal 21 be equal to or less than the gap L1 between the five via holes 27A (27B) arranged in the longitudinal direction (second direction) and the first signal terminal 21.

Note that, as illustrated in FIG. 3A, on the front surface of the first dielectric layer 20, first DC voltage terminals 28A and 28B are respectively formed on both sides of the first ground terminal 25 in the lateral direction. DC voltage wires 29A and 29B extending in the longitudinal direction are respectively connected to the first DC voltage terminals 28A and 28B.

As illustrated in FIG. 4B, a second signal terminal part and a second ground terminal part are formed on the back surface of the flexible printed circuit board 11, and the second signal terminal part and the second ground terminal part are respectively connected to the first signal terminal part and the first ground terminal part in an overlapping manner. The flexible printed circuit board 11 includes a second dielectric layer 30. The second signal terminal part is a second signal terminal 42 (one terminal) formed on the back surface of the second dielectric layer 20. The second ground terminal part is a second ground terminal 45 formed on the back surface of the second dielectric layer 20. Moreover, second DC voltage terminals 48A and 48B are respectively formed on both sides of the second ground terminal 45. The second signal terminal 42, the second ground terminal 45, and the second DC voltage terminals 48A and 48B are physically in contact with (overlap) and connected to the first signal terminal 21, the first ground terminal 25, and the first DC voltage terminals 28A and 28B illustrated in FIG. 3A via a conductive bonding agent such as solder. The corresponding terminals have the same shapes. Further, on the back surface of the second dielectric layer 30, a second ground conductor layer 34 is formed and electrically connected to the second ground terminal 45. Note that, the second ground conductor layer 34 and the second ground terminal 45 are integrally formed, and are formed by a single piece of metal foil.

As illustrated in FIG. 4A, a third signal terminal part and a third ground terminal part are formed on the front surface of the flexible printed circuit board 11. The third signal terminal part is a third signal terminal 31 (one terminal) formed on the front surface of the second dielectric layer 30. The third signal terminal 31 overlaps, in a plan view, the second signal terminal 42 so as to match the second signal terminal 42, and has the same shape as that of the second signal terminal 42. The third signal terminal 31 is electrically connected to the second signal terminal 42 via three (a plurality of) via holes 40 (second through signal conductors). A signal wire 32 electrically connected to the third signal terminal 31 is constructed with a single strip conductor extending in the longitudinal direction (second direction) so as to have a predetermined width (third width). The third signal terminal 31 is connected to the second signal wire 32 via a transition part 33. Note that, the third signal terminal 31, the transition part 33, and the second signal wire 32 are integrally formed, and are formed by a single piece of metal foil. The width (second width) of the third signal terminal 31 is wider than the width (third width) of the second signal wire 32. Note that, the width (second width) of the third signal terminal 31 is wider than the width (third width) of the second signal wire 32 due to the shape taking impedance matching into account, but the shape is not limited thereto. The shape is appropriately selected depending to materials and thicknesses of the first dielectric layer and the second dielectric layer. The second ground conductor layer 34 is formed on the back surface of the second dielectric layer 30 so as to include a region opposed to the second signal wire 32 formed on the front surface of the second dielectric layer 30 and regions extending on both sides of the opposed region. On this occasion, the second signal terminal 42 formed on the back surface of the second dielectric layer 30 is connected to the first signal terminal 21 of the printed circuit board 2 in an overlapping manner, and hence the second ground conductor layer 34 is not formed in a region of the second signal terminal 42 and peripheral regions thereof on the back surface of the second dielectric layer 30. The second signal wire 32 (and the transition part 33) and the second ground conductor layer 34 construct a microstrip line (single-ended transmission line TL). As described above, the transmission line according to the present invention is not limited to this configuration, and the transmission line may be constructed with a grounded coplanar line. In other words, on the front surface of the second dielectric layer 30, a pair of second ground wires (not shown) may be formed, which respectively have rectangular shapes connected to third ground terminals 35A and 35B and extending in the longitudinal direction (second direction) on both sides of the second signal wire 32. The grounded coplanar line is constructed between the pair of second ground wires and the second signal wire 32 (and the transition part 33), and the second ground conductor layer 34.

The third ground terminal part includes the third ground terminals 35A and 35B formed on the front surface of the second dielectric layer 30. The third ground terminals 35A and 35B overlap the second ground terminal 45 in a plan view. However, on the front surface of the second dielectric layer 30, the second signal wire 32 extending in the longitudinal direction from the third signal terminal 31 via the transition part 33 is formed, and, in a plan view, the second signal wire 32 or the transition part 33 includes a region overlapping the second ground terminal 45. Thus, the third ground terminals 35A and 35B are not formed in a region in which the second signal wire 32 and the transition part 33 are formed and peripheral regions thereof on the front surface of the second dielectric layer 30. Thus, it is desired that the third ground terminals 35A and 35B overlap the second ground terminal 45 in a wider area while separated from the second signal wire 32 and the transition part 33 by a desired gap or more so as not to be electrically connected to the second signal wire 32. According to this embodiment, the third signal terminal 31 has a rectangular shape extending in the second direction. The third ground terminals 35A and 35B extend upward in the longitudinal direction (second direction) on both sides of the third signal terminal 31 from the illustrated bottom end so as to have a predetermined width (in the first and second regions), respectively bend inward above the illustrated top end of the third signal terminal 31, extend in the lateral direction so as to have a predetermined width, and reach a neighborhood of the transition part 33 and the second signal wire 32. In other words, the third ground terminals 35A and 35B include, in a plan view, the parts extending in the longitudinal direction respectively on both sides of the third signal terminal 31, and parts extending in the lateral direction (first direction) in the region (fourth region) above the top end of the third signal terminal 31 in the third region. Note that, the transition part 33 has a shape tapered from a bottom end to a top end. Therefore, the third ground terminals 35A and 35B reach a neighborhood of the transition part 33 so as to be closer thereto while separated by a desired gap or more, and hence distal ends of the third ground terminals 35A and 35B have a tapered shape reverse to that of the transition part 33.

Figure 16A:
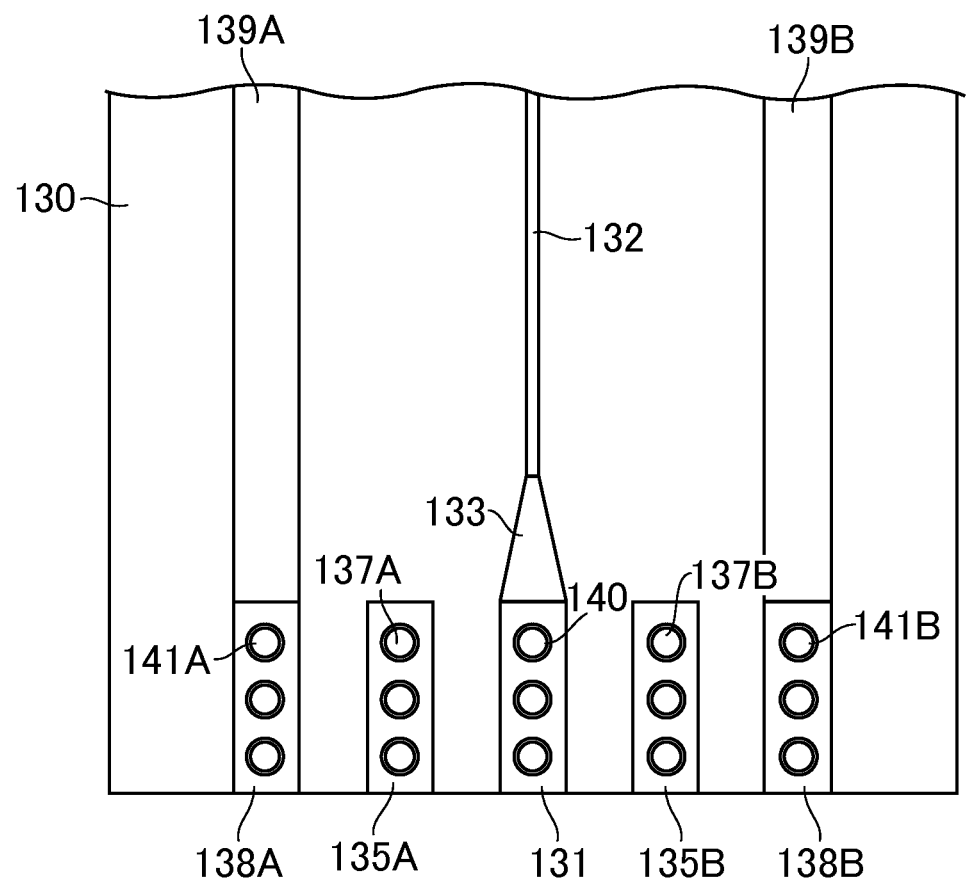
FIG. 16A is a plan view of a second printed circuit board end part according to the related art.
Figure 16B:
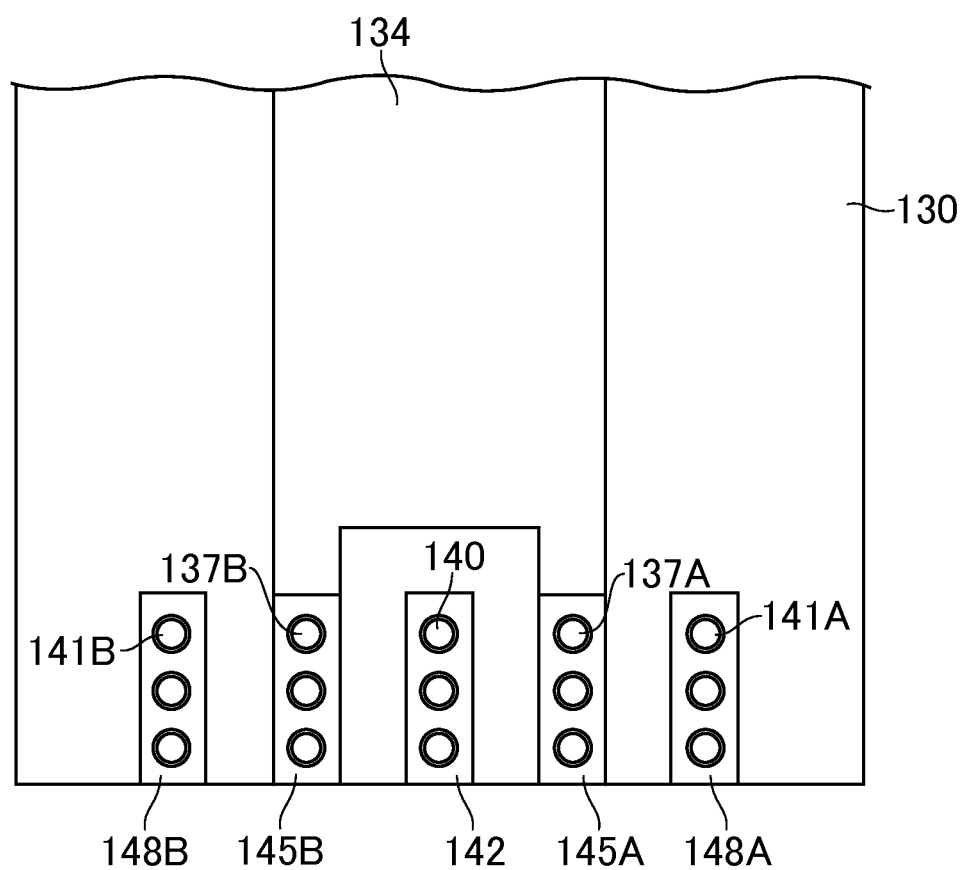
FIG. 16B is a bottom view of the second printed circuit board end part according to the related art.

The third ground terminals 35A and 35B are respectively electrically connected to the second ground terminal 45 via a plurality of via holes 36A, 37A, 36B, and 37B. On this occasion, the plurality of via holes are second through ground conductors, which pass through the second dielectric layer 30 from the back surface to the front surface, and are electrically connected to the second ground terminal 45. The second through ground conductors are also electrically connected to the third ground terminals 35A and 35B in addition to the second ground terminal 45. The second through ground conductors according to this embodiment include five via holes 37A, five via holes 37B, and two via holes 36A and 36B. The via holes 37A (37B) are formed in the third ground terminal 35A (35B) at the part extending in the longitudinal direction on the side of the third signal terminal 31. The via hole 36A (36B) is formed in the third ground terminal 35A (35B) at the part extending in the lateral direction in the fourth region. As illustrated in FIG. 16A, in the terminal part of the second circuit board according to the related art, in a plan view, in a periphery of the third signal terminal 131 extending in the longitudinal direction (second direction), only the third ground terminals 135A and 135B extending in the longitudinal direction (second direction) on both the left and right sides of the third signal terminal 131 exist. In other words, the ground terminal part is formed only in the first region and the second region of the signal terminal part. Moreover, in the terminal part of the second circuit board according to the related art, in a plan view, the ground conductors extending in the direction perpendicular to the drawing sheet in the periphery of the third signal terminal 131 are only the via holes 137A and 137B respectively arranged on both the left and right sides of the third signal terminal 131. In other words, the ground conductors are formed only in the first region and the second region.

In contrast, as illustrated in FIG. 4A, on the flexible printed circuit board 11 according to this embodiment, the third ground terminal part is constructed with the two third ground terminals 35A and 35B, and is formed in the fourth region in addition to the first and second regions. In other words, the region in which the third ground terminal part is formed includes (a part of) the fourth region in a plan view. Moreover, on the flexible printed circuit board 11 according to this embodiment, due to the construction of the third ground terminal part, the plurality of via holes are formed in the fourth region in addition to the first and second regions. In other words, the region in which the plurality of via holes (second through ground conductors) are formed includes (a part of) the fourth region in a plan view.

Now, a case in which a high frequency electrical signal propagates from the first circuit board to the second circuit board is considered. In the transmission line on the first circuit board, the high frequency electrical signal propagates in the extension direction of the signal wire on the circuit board, namely, in the direction parallel to a plane of the circuit board. Then, at the connection position between the first circuit board and the second circuit board, the propagation direction transitionally changes from the parallel direction to a vertical direction, and then, on the second circuit board, the high frequency electrical signal propagates in the parallel direction. According to this embodiment, at the connection position between the first circuit board and the second circuit board, namely, at the location at which the propagation direction of the high frequency electrical signal transitionally changes from the direction parallel to the plane of the circuit board to the vertical direction, the first ground terminal connected to the first through ground conductors and the second ground terminal connected to the second through ground conductors are connected to each other via solder, to thereby enhance the confinement of the high frequency electrical signal and suppress the radiation and the reflection in the extension direction. Consequently, appropriate transmission characteristics are realized.

The third signal terminal 31 of the flexible printed circuit board 11 serves to electrically connect the second signal terminal 42 and the second signal wire 32 to each other. However, although the third ground terminals 35A and 35B are electrically connected to the second ground terminal 45 via the via holes 36A, 37A, 36B, and 37B, the second through ground conductors mainly serve as the ground conductors extending through the flexible printed circuit board 11 in the vertical direction, and the role of the third ground terminals 35A and 35B is small. However, according to this embodiment, the first signal terminal 21 and the first ground terminal 25 of the printed circuit board 2 are connected (bonded) to the second signal terminal 42 and the second ground terminal 45 of the flexible printed circuit board 11 by means of soldering. During the connection, heat needs to be applied to solve the solder. By being heated, the third signal terminal 31 and the third ground terminals 35A and 35B also have a role to transfer the heat to the second signal terminal 42 and the second ground terminal 45 via the via holes. Moreover, in terms of the transfer of the heat when the first ground terminal 25 and the second ground terminal 45 are entirely connected to each other by means of soldering, it is desired that the third ground terminal part (third ground terminals 35A and 35B) and the second through ground conductors (plurality of via holes 36A, 37A, 36B, and 37B) be formed also in the fourth region in a plan view. The third ground terminal part according to this embodiment has a structure desirable for transferring the heat to the second ground terminal part when the connection is made by means of soldering.

Note that, as illustrated in FIG. 4A, on the front surface of the second dielectric layer 30, third DC voltage terminals 38A and 38B are respectively formed on both sides of the third ground terminals 35A and 35B in the lateral direction. The third DC voltage terminals 38A and 38B are respectively electrically connected to second DC voltage terminals 48A and 48B via a plurality of via holes 41A and 41B. Further, DC voltage lines 39A and 39B extending in the longitudinal direction are respectively connected to the third DC voltage terminals 38A and 38B.

Figure 7:
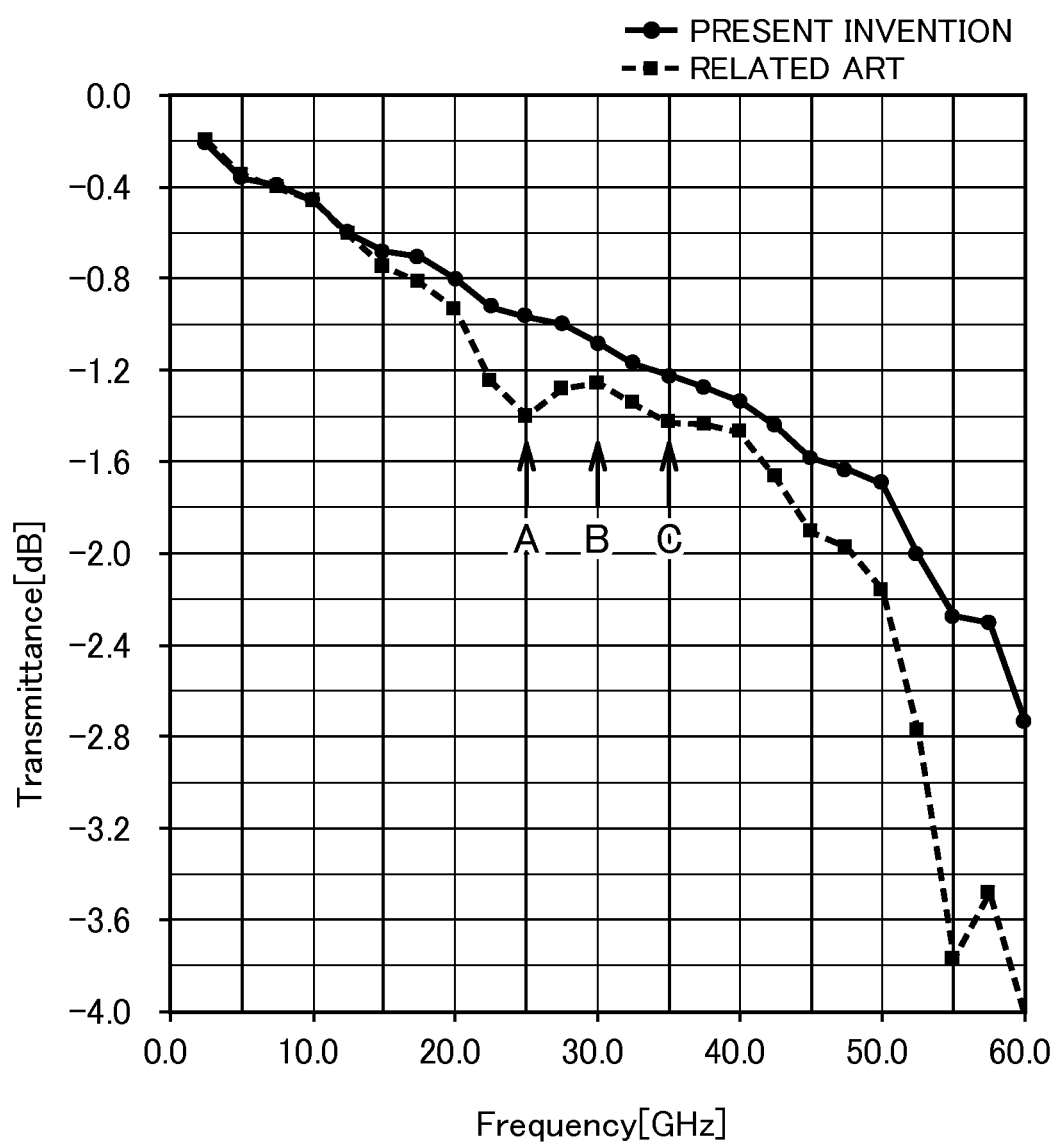
FIG. 7 is a graph for showing a signal transmission characteristic of an optical module according to the first embodiment of the present invention.

FIG. 7 is a graph for showing a signal transmission characteristic of the optical module according to this embodiment. In FIG. 7, by means of three-dimensional electromagnetic field simulation, a transmittance (symbol ●) of the optical module according to this embodiment with respect to the frequency is shown together with a transmittance (symbol ■) of the optical module according to the related art illustrated in FIG. 15A to FIG. 16B. As shown in FIG. 7, the transmittance according to the related art presents a local fall around 25 GHz (A of the graph). Moreover, the transmittance rises again from 25 GHz to a neighborhood of 30 GHz (B of the graph), but the transmittance presents a steep degradation on a high frequency side of 35 GHz (C of the graph). In contrast, the transmittance according to this embodiment, which is different from that of the related art, does not present the local fall in the neighborhood of 25 GHz, and gradually falls up to a neighborhood of 50 GHz. In other words, in the optical module according to this embodiment, compared with the optical module according to the related art, the degradation of the transmittance is suppressed. Particularly, up to the neighborhood of 50 GHz, the degradation of the transmittance is remarkably reduced, and an appropriate signal transmission characteristic is realized.

Moreover, the inventors of the present invention measured the Eye Mask of the optical module according to this embodiment at 25 Gbit/s prescribed by IEEE 802.3ba. While the mask margin of the optical module according to the related art is 20% to 30%, the mask margin of the optical module according to this embodiment is 40% to 50%. A remarkable improvement is observed in the signal waveform, and an appropriate signal transmission characteristic is realized. Thus, the printed circuit board 2 and the flexible printed circuit board 11 according to this embodiment are optimal for an optical module and an optical transceiver module including optical high frequency components solely used for optical communication at a transmission speed of 25 Gbit/s.

Second Embodiment

Figure 8A:
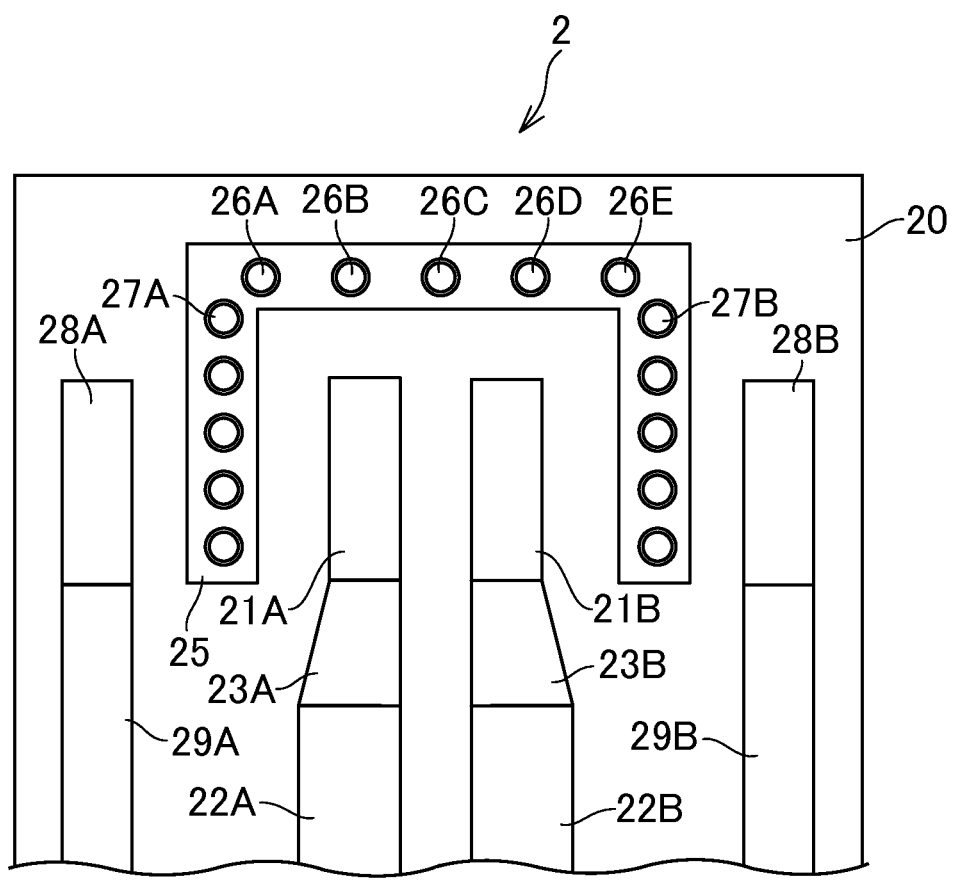
FIG. 8A is a plan view of a printed circuit board end part according to a second embodiment of the present invention.
Figure 8B:
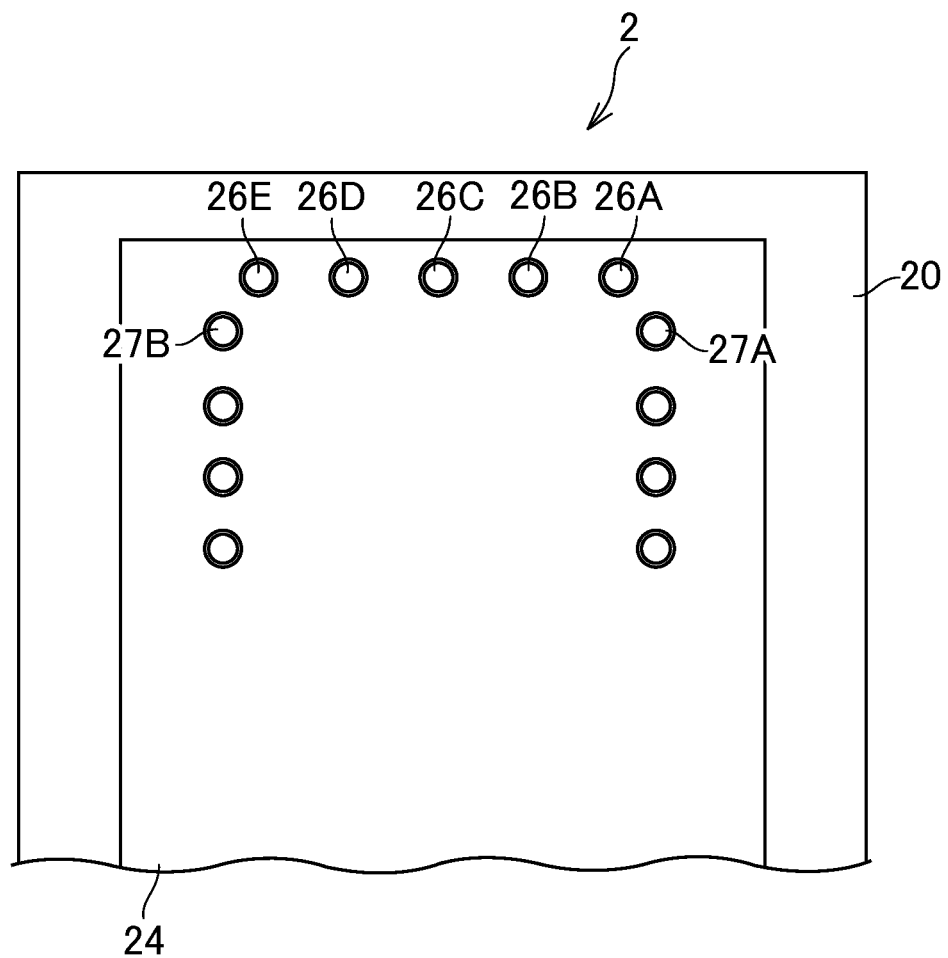
FIG. 8B is a bottom view of the printed circuit board end part according to the second embodiment of the present invention.
Figure 9A:
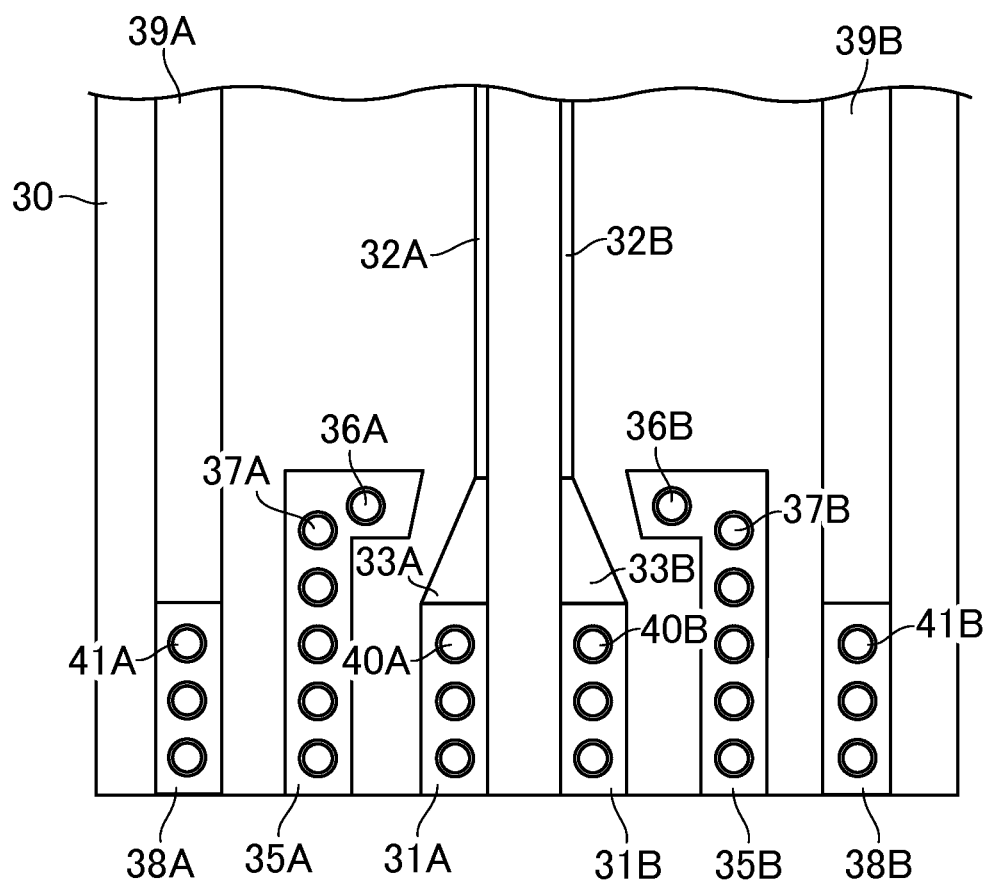
FIG. 9A is a plan view of a flexible printed circuit board end part according to the second embodiment of the present invention.
Figure 9B:
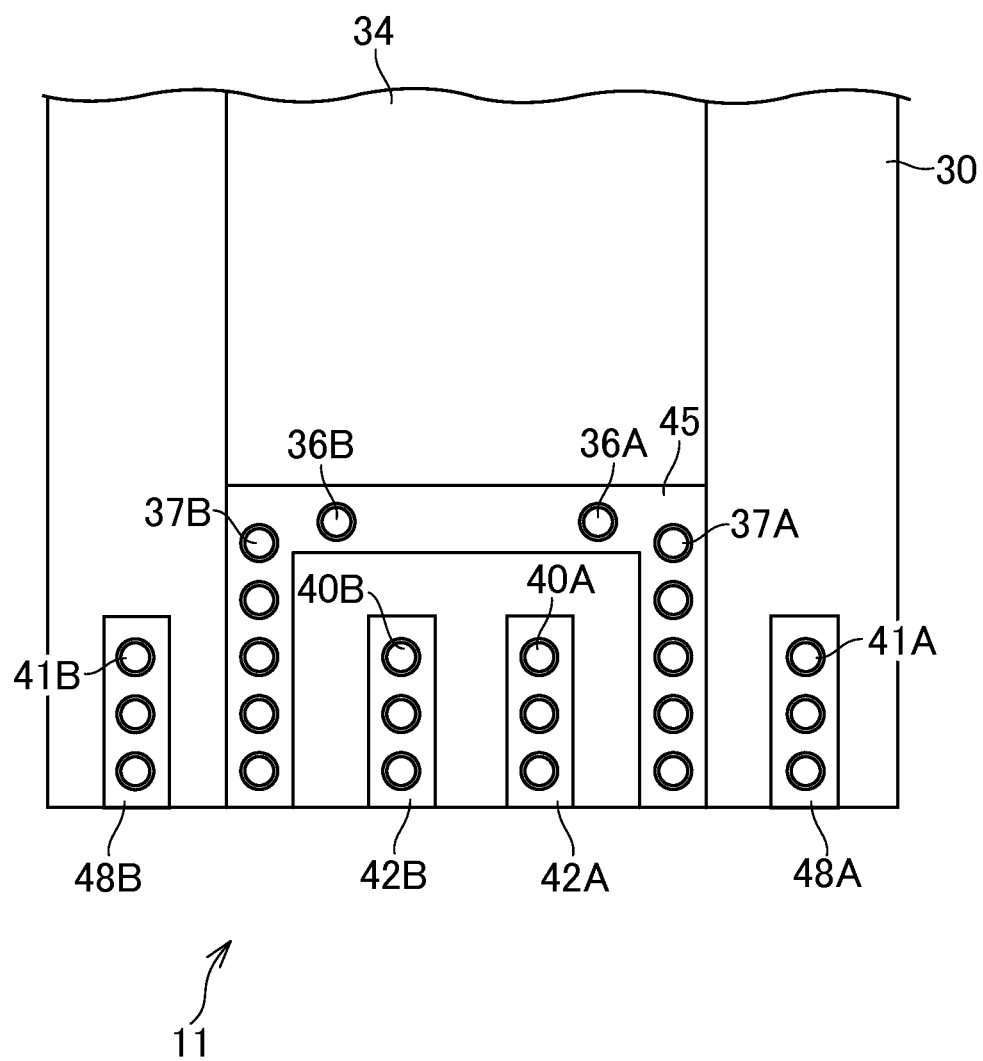
FIG. 9B is a bottom view of the flexible printed circuit board end part according to the second embodiment of the present invention.

FIG. 8A and FIG. 8B are respectively a plan view and a bottom view of an end part of a printed circuit board 2 (first circuit board) according to a second embodiment of the present invention. FIG. 9A and FIG. 9B are respectively a plan view and a bottom view of an end part of a flexible printed circuit board 11 (second circuit board) according to this embodiment. In the first embodiment, the single-ended transmission line is formed on the circuit board, but in this embodiment, a differential transmission line is formed on the circuit board. As a result, the configurations of the printed circuit board 2 and the flexible printed circuit board 11 according to this embodiment are different from those of the first embodiment in the following points, but the other configurations are the same as those of the first embodiment.

As illustrated in FIG. 8A, the first signal terminal part includes a pair of (two) first signal terminals 21A and 21B extending in the longitudinal direction and arranged in the lateral direction, and each having a rectangular shape. Moreover, first signal wires 22A and 22B are formed of a pair of (two) strip conductors having a predetermined width (fourth width), extending in the longitudinal direction while keeping a predetermined gap therebetween, and arranged in the lateral direction. The first signal terminals 21A and 21B are respectively connected to the first signal wires 22A and 22B via transition parts 23A and 23B. A width (fifth width) of the first signal terminals 21A and 21B is slightly narrower than the width (fourth width) of the first signal wires 22A and 22B. Moreover, as illustrated in FIG. 9B, the second signal terminal part includes second signal terminals 42A and 42B.

As illustrated in FIG. 9A, the third signal terminal part includes third signal terminals 31A and 31B. Moreover, second signal wires 32A and 32B are formed of a pair of (two) strip conductors having a predetermined width (sixth width), extending in the longitudinal direction while keeping a predetermined gap therebetween, and arranged in the lateral direction. The third signal terminals 31A and 31B are respectively connected to the second signal wires 32A and 32B via transition parts 33A and 33B. The width (fifth width) of the third signal terminals 31A and 31B is wider than the width (sixth width) of the second signal wires 32A and 32B. The second signal terminals 42A and 42B and the third signal terminals 31A and 31B are respectively electrically connected to each other via three (a plurality of) via holes 40A and 40B. Note that, the width (fifth width) of the first signal terminals 21A and 21B is slightly narrower than the width (fourth width) of the first signal wires 22A and 22B and the width (fifth width) of the third signal terminals 31A and 31B is wider than the width (sixth width) of the second signal wires 32A and 32B due to the shape taking impedance matching into account, but the shape is not limited to this example. The shape is appropriately selected depending on materials and thicknesses of the first dielectric layer and the second dielectric layer.

The first signal terminal part is constructed with the first signal terminals 21A and 21B, and, as a result, the shape of the first ground terminal part arranged in the periphery of the first signal terminal part is different from that of the first embodiment. Specifically, the first ground terminal 25 has a shape surrounding both the left and right sides and further the top side of the first signal terminal part as in the first embodiment, but the length of a part of the first ground terminal 25 extending in the lateral direction in the fourth region is increased because the width of the first signal terminal part in the lateral direction is increased. In this part, a plurality of via holes 26A, 26B, 26C, 26D, and 26E are formed. Note that, the second ground terminal 45 formed on the printed circuit board 2 has the same shape as the shape of the first ground terminal 25 connected to the second ground terminal 45 in an overlapping manner, and, as a result, the gap between the third ground terminals 35A and 35B is increased.

When a plurality of single-ended transmission lines are formed on the circuit board, a ground terminal and a signal terminal are generally arranged on a terminal part while being repeated a plurality of times in the first direction. When a plurality of pairs of differential transmission lines are formed on the circuit board, a ground terminal and a pair of signal terminals are generally arranged on a terminal part while being repeated a plurality of times in the first direction. Thus, the present invention is not limited to the one single-ended transmission line and the pair of differential transmission lines, and can be applied also to a case in which the signal terminal part and the ground terminal part are repeated. Further, a description is given above of the case in which the first (second) signal terminal part is constructed with one or a pair of signal terminals, but the present invention is not limited to this configuration. A plurality of (or a plurality of pairs of) signal terminals may be sequentially arranged in the first direction, and may extend in the second direction.

Third Embodiment

Figure 10A:
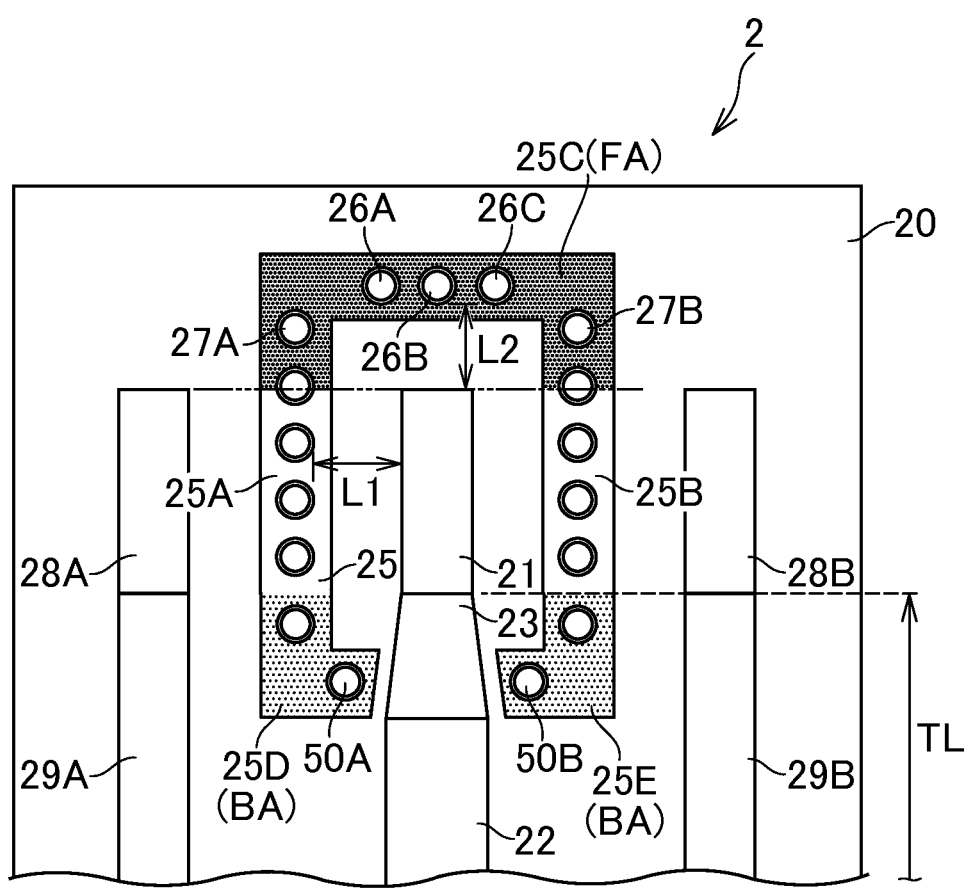
FIG. 10A is a plan view of a printed circuit board end part according to a third embodiment of the present invention.
Figure 11A:
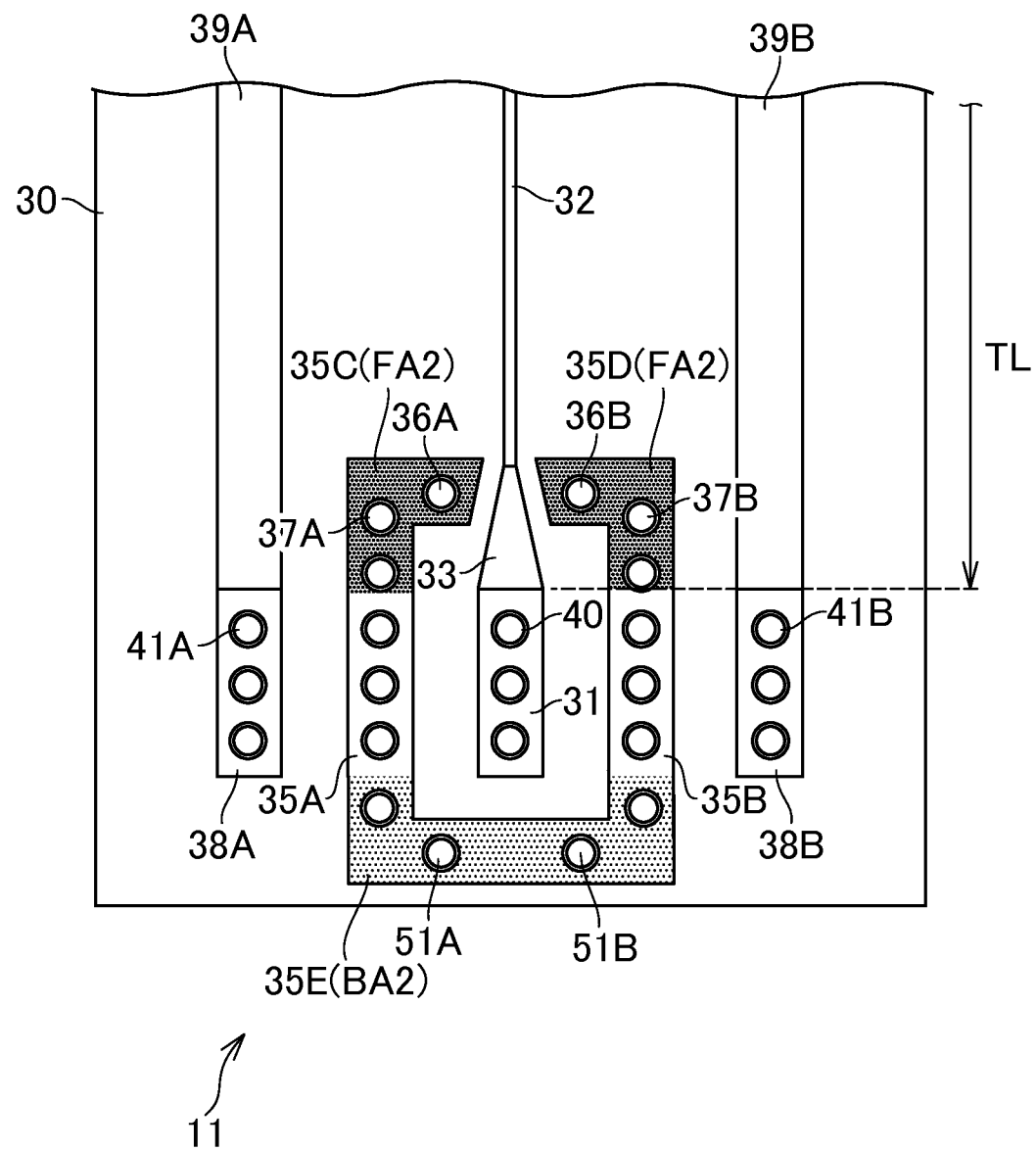
FIG. 11A is a plan view of a flexible printed circuit board end part according to the third embodiment of the present invention.

FIG. 10A and FIG. 10B are respectively a plan view and a bottom view of an end part of a printed circuit board 2 (first circuit board) according to a third embodiment of the present invention. FIG. 11A and FIG. 11B are respectively a plan view and a bottom view of an end part of a flexible printed circuit board 11 (second circuit board) according to this embodiment. In the first embodiment, the first ground terminal part, the first through ground conductors, the second ground terminal part, and the second through ground conductors are formed only in the fourth region in the third region, but in this embodiment, the first ground terminal part, the first through ground conductors, the second ground terminal part, and the second through ground conductors are each formed further in the fifth region. As a result, the configurations of the printed circuit board 2 and the flexible printed circuit board 11 according to this embodiment are different from those of the first embodiment in the following points, but the other configurations are the same as those of the first embodiment.

As illustrated in FIG. 10A, the first ground terminal part is a first ground terminal 25 (not shown) constructed with five first ground terminals 25A, 25B, 25C, 25D, and 25E. The five first ground terminals 25A, 25B, 25C, 25D, and 25E are integrally formed, and are formed by a single piece of metal foil. On this occasion, similarly to the first ground terminal 25 according to the first embodiment, the first ground terminal 25A is formed in the first region, the first ground terminal 25B is formed in the second region, and the first ground terminal 25C is formed in the fourth region (including the shaded region FA of FIG. 10A). Further, the first ground terminals 25D and 25E are formed in the fifth region (including the shaded regions BA of FIG. 10A), which is different from the first embodiment. In other words, the shape of the first ground terminal 25 is obtained by adding the shapes of the shaded regions BA of FIG. 10A to the shape of the first ground terminal 25 according to the first embodiment. On the front surface of the first dielectric layer 20, the first signal wire 22 extending in the longitudinal direction from the first signal terminal 21 via the transition part 23 is formed, and it is desired that the first ground terminal 25 overlap the first ground conductor layer 24 in a wider area while separated by a desired gap or more from the first signal wire 22 and the transition part 23 so as not to be electrically connected to the first signal wire 22. According to this embodiment, the first ground terminal 25 extends in the longitudinal direction (second direction) on both sides of the first signal terminal 21 so as to have a predetermined width (the extending parts include the first ground terminals 25A and 25B). Further, the first ground terminal 25 respectively bends inward above the illustrated top end of the first signal terminal 21, extends in the lateral direction so as to have a predetermined width, and connects to each other. Moreover, the first ground terminal 25 respectively bends inward below the illustrated bottom end of the first signal terminal 21, extends in the lateral direction so as to have a predetermined width, and reaches a neighborhood of the transition part 23 and the first signal wire 22. In other words, the first ground terminal 25 includes, in a plan view, the parts extending in the longitudinal direction on both sides of the first signal terminal 21, the part extending in the lateral direction (first direction) in the region (fourth region) above the top end of the first signal terminal 21 in the third region, and the parts extending in the lateral direction in the region (fifth region) below the bottom end of the first signal terminal 21 in the third region.

A plurality of via holes are formed in the region in which the first ground terminal 25 is formed. Specifically, in the region in which the first ground terminal 25 is formed, the six via holes 27A are formed in the region extending in the longitudinal direction on the left side of the first signal terminal 21, the six via holes 27B are formed in the region extending in the longitudinal direction on the right side of the first signal terminal 21, the three via holes 26A, 26B, and 26C are formed in the region extending in the lateral direction in the fourth region, and via holes 50A and 50B respectively on the left and right sides are formed in the regions extending in the lateral direction in the fifth region. In other words, while the first ground terminal part and the first through ground conductors according to the first embodiment are formed in the first, second, and fourth regions, the first ground terminal part and the first ground terminal connected to the first through ground conductors according to this embodiment are further formed in the fifth region.

As illustrated in FIG. 11B, the second ground terminal part is a second ground terminal 45 (not shown) constructed with five second ground terminals 45A, 45B, 45F, 45G, and 45H, and has the same shape as that of the first ground terminal 25 connected to the second ground terminal 45 in an overlapping manner. On this occasion, the second ground terminal 45A is formed in the first region, the second ground terminal 45B is formed in the second region, the second ground terminal 45F is formed in the fourth region (including the shaded region FA3 of FIG. 11B), and the second ground terminals 45G and 45H are formed in the fifth region (including the shaded regions BA3 of FIG. 11B). In other words, the second ground terminal 45 includes, in a plan view, in addition to the parts formed in the first region and the second region, the part (region FA3) formed in the fourth region and the parts (regions BA3) formed in the fifth region. Moreover, as illustrated in FIG. 11A, the third ground terminal part is a third ground terminal 35 (not shown) constructed with five third ground terminals 35A, 35B, 35C, 35D, and 35E. In other words, the third ground terminal 35 includes, in addition to parts (third ground terminals 35A and 35B) formed in the first and second regions, parts (regions FA2; third ground terminals 35C and 35D) formed in the fourth region, and a part (region BA2; third ground terminal 35E) formed in the fifth region. The third ground terminal 35 extends in the longitudinal direction (second direction) on both sides of the second signal terminal 31 so as to have a predetermined width (in the first and second regions). Further, the third ground terminal 35 respectively bends inward above the illustrated top end of the second signal terminal 31, extends in the lateral direction so as to have a predetermined width, and reaches a neighborhood of the transition part 33 and the first signal wire 32. Further, the third ground terminal 35 respectively bends inward below the illustrated bottom end of the second signal terminal 31, extends in the lateral direction so as to have a predetermined width, and connects to each other. In other words, the third ground terminal 35 includes, in a plan view, the parts extending in the longitudinal direction on both sides of the second signal terminal 31, the parts extending in the lateral direction (first direction) in the region (fourth region) located above the top end of the second signal terminal 31 in the third region, and the part extending in the lateral direction in the region (fifth region) below the bottom end of the second signal terminal 31 in the third region.

A plurality of via holes are formed in the region in which the second ground terminal 45 and the third ground terminal 35 are formed. Specifically, in the region in which the third ground terminal 35 is formed, the six via holes 37A are formed in the region extending in the longitudinal direction on the left side of the second signal terminal 31, the six via holes 37B are formed in the region extending in the longitudinal direction on the right side of the second signal terminal 31, the via holes 36A and 36B respectively on the left and right sides are formed in the regions extending in the lateral direction in the fourth region, and two via holes 51A and 51B are formed in the region extending in the lateral direction in the fifth region. In other words, while the second ground terminal part and the second through ground conductors according to the first embodiment are formed in the first, second, and fourth regions, the second ground terminal part and the second through ground conductors according to this embodiment are further formed in the fifth region.

On the first circuit board and the second circuit board according to this embodiment, the first through ground conductors and the second through ground conductors are formed both in the fourth and fifth regions in addition to the first and second regions. In terms of a further reduction in the reflection and the radiation at the connection position, this configuration is desired. However, the configuration is not limited thereto. For example, only the first through ground conductors of the first circuit board (printed circuit board 2) may be formed in at least one of the fourth region or the fifth region, and only the second through ground conductors of the second circuit board (flexible printed circuit board 11) may be formed in at least one of the fourth region or the fifth region. Alternatively, those configurations may be combined. Any of the configurations provides the effect of the present invention.

In general, the terminal parts of the flexible printed circuit board 11 are arranged along an outer edge of the flexible printed circuit board in order to reduce the area (overlapping area) connected to another circuit board in an overlapping manner. However, the blank region may be provided between the outer edge of the flexible printed circuit board and the signal terminal part as in the flexible printed circuit board 11 according to this embodiment, and the ground terminal and the through ground conductors may be arranged therein. Without any intention to further reduce the reflection and the radiation at the connection position, it is difficult to reach this idea even by increasing the overlapping area.

Note that, the first signal terminal part of the first circuit board and the second signal terminal part of the second circuit board are connected to each other in an overlapping manner, and the first signal terminal part and the second signal terminal part thus have the same shape. In other words, parts connected to each other in an overlapping manner may be respectively defined as the first signal terminal part and the second signal terminal part. A positional relationship between the first signal terminal part and the second signal terminal part overlapping each other, and the first signal wire and the second signal wire to be connected thereto is now considered. Both ends of the first signal terminal part and the second signal terminal part overlapping each other are referred to as "one side" and "the other side" in a plan view. The first signal wire is connected to the one side of the first signal terminal part, and the second signal wire is connected to the other side of the second signal terminal part. Therefore, in the third region prescribed at the location beyond the first signal terminal part (second signal terminal part) in the second direction, the fourth region is located on the other side. In other words, the other side can be said as the second signal wire side, or an opposite side of the first signal wire across the first signal terminal part. Similarly, the fifth region is located on the one side. In other words, the one side can be said as the first signal wire side, or an opposite side of the second signal wire across the second signal terminal part.

Fourth Embodiment

Figure 12A:
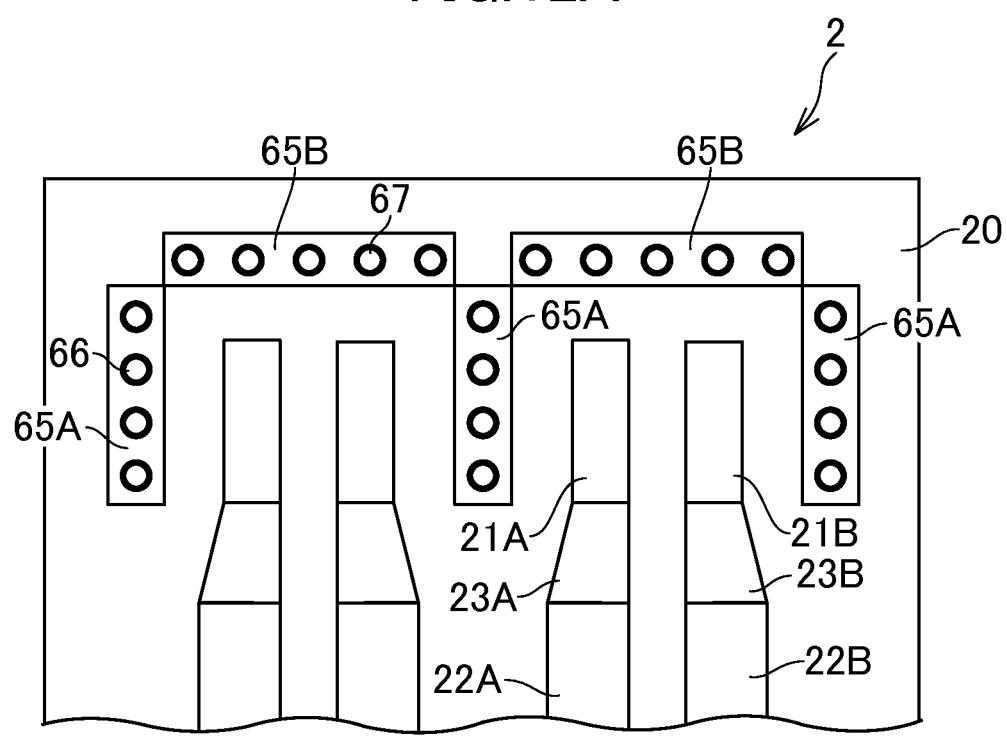
FIG. 12A is a plan view of a printed circuit board end part according to a fourth embodiment of the present invention.
Figure 12B:
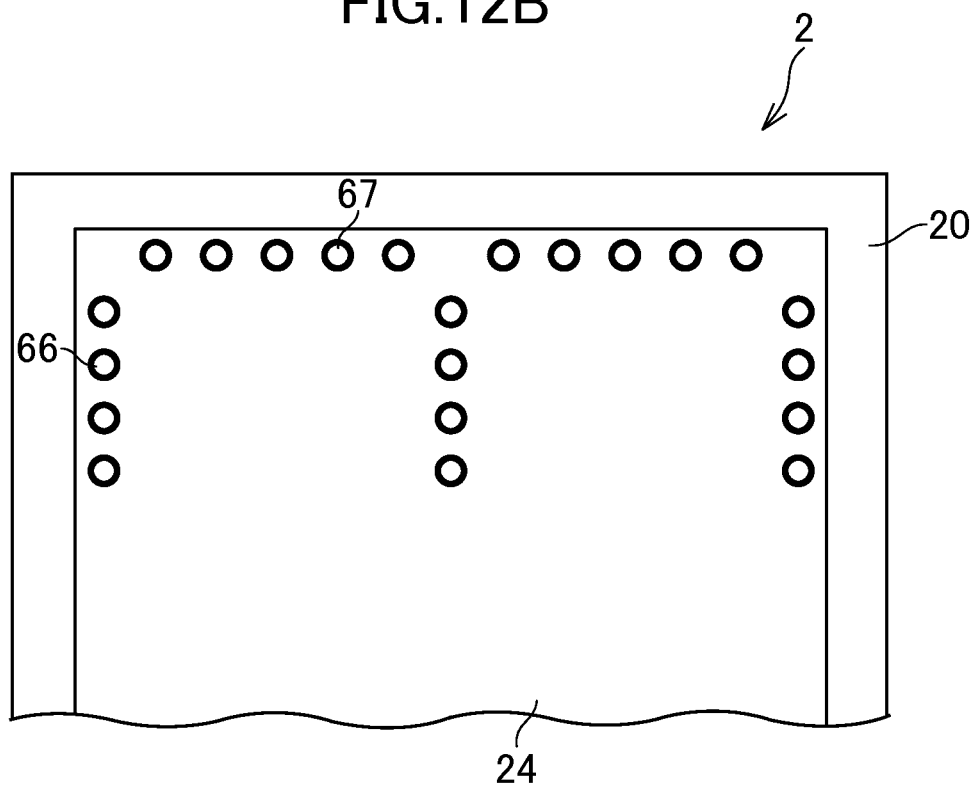
FIG. 12B is a bottom view of the printed circuit board end part according to the fourth embodiment of the present invention.
Figure 13A:
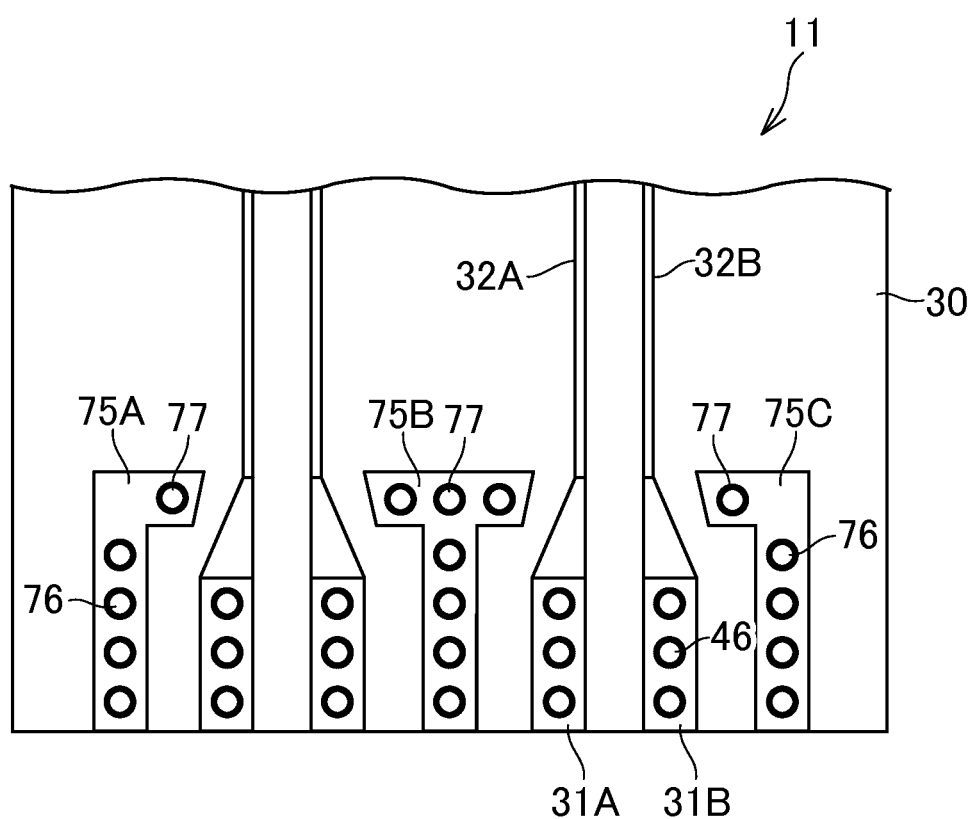
FIG. 13A is a plan view of a flexible printed circuit board end part according to the fourth embodiment of the present invention.
Figure 13B:
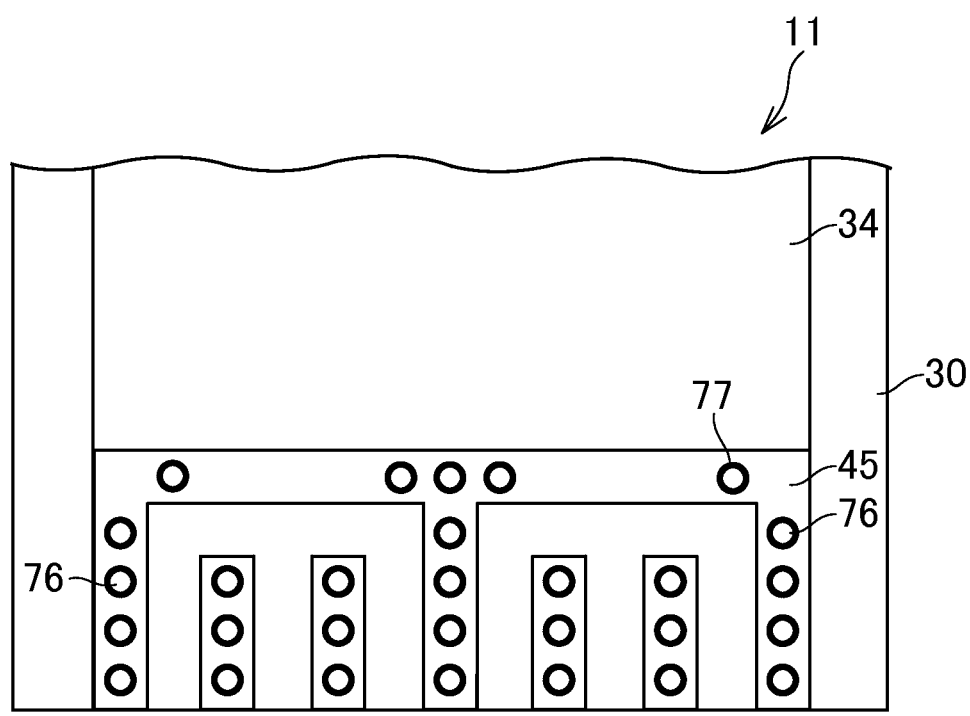
FIG. 13B is a bottom view of the flexible printed circuit board end part according to the fourth embodiment of the present invention.

FIG. 12A and FIG. 12B are respectively a plan view and a bottom view of an end part of a printed circuit board 2 (first circuit board) according to a fourth embodiment of the present invention. FIG. 13A and FIG. 13B are respectively a plan view and a bottom view of an end part of a flexible printed circuit board 11 (second circuit board) according to this embodiment. In the second embodiment, a pair of differential transmission lines are formed on the circuit board, but in this embodiment, a plurality of pairs of differential transmission lines are formed on the circuit board. Note that, the first ground terminal part, the second ground terminal part, and the third ground terminal part are formed only in the first region, the second region, and the fourth region as in the first embodiment. Moreover, the first ground terminal part according to the first to third embodiments is integrally formed, but the first ground terminal part according to this embodiment is separately formed. As a result, the configurations of the printed circuit board 2 and the flexible printed circuit board 11 according to this embodiment are different from those of the first and second embodiments in the following points, but the other configurations are the same as those of the first and second embodiments.

As illustrated in FIG. 12A, on the printed circuit board 2, two pairs of the first signal terminals 21A and 21B are respectively connected to two pairs of the first signal wires 22A and 22B via two pairs of the transition parts 23A and 23B. In other words, according to this embodiment, the two first signal terminal parts are formed on the printed circuit board 2.

As illustrated in FIG. 12A, the first ground terminal part according to this embodiment includes three first ground terminals 65A extending in the longitudinal direction (second direction) and two first ground terminals 65B extending in the lateral direction (first direction). The left first ground terminal 65A, the center first ground terminal 65A, and the left first ground terminal 65B of FIG. 12A correspond to the first ground terminal 25 according to the first embodiment, and are included in the region in which the first ground terminal 25 illustrated in FIG. 3A is formed. In other words, those three first ground terminals are three parts acquired by removing bent portions from the U shape of the first ground terminal 25 according to the first embodiment. Similarly, the center first ground terminal 65A, the right first ground terminal 65A, and the right first ground terminal 65B of FIG. 12A correspond to the first ground terminal 25 according to the first embodiment. In this way, the first ground terminal part according to this embodiment includes the plurality of first ground terminals formed so as to be separated from one another. Each of the three first ground terminals 65A is electrically connected to the first ground conductor layer 24 via four via holes 66 arranged in the longitudinal direction. Each of the two first ground terminals 65B is electrically connected to the first ground conductor layer 24 via five via holes 67 arranged in the lateral direction. Thus, the printed circuit board 2 according to this embodiment provides the effect of the present invention. Note that, the first ground terminal part may be integrally formed. However, when the first ground terminal part is integrally formed, the area of each terminal (first ground terminal part) is large, and an amount of solder used for soldering for each terminal is thus large. As a result, a thickness of the solder at this terminal tends to vary. According to this embodiment, the areas of the respective terminals can be reduced because the first ground terminal part is constructed with the plurality of first ground terminals separated from one another, and consequently, the variation in the thickness of the solder at the respective terminals can be suppressed.

Note that, as illustrated in FIG. 12B, depending on the shape of the first ground terminal part according to this embodiment, the arrangement of the via holes formed in the first ground conductor layer 24 is different from that of the first embodiment. Further, as illustrated in FIG. 13B, depending on the shape of the first ground terminal part, the shape of the second ground terminal part is also different from that of the first embodiment. In a strict sense, the second ground terminal part is connected to the first ground terminal part in an overlapping manner, and is different in the shape from the second ground terminal 45 illustrated in FIG. 13B, but the details are not illustrated for the sake of simple illustration. Moreover, as illustrated in FIG. 13A, on the flexible printed circuit board 11, two pairs of the third signal terminals 31A and 31B are respectively connected to two pairs of the second signal wires 32A and 32B via two pairs of transition parts. As a result, the third ground terminal part according to this embodiment includes three third ground terminals 75A, 75B, and 75C. The third ground terminals 75A and 75B illustrated in FIG. 13A correspond to the third ground terminals 35A and 35B according to the first embodiment illustrated in FIG. 4A. Similarly, the third ground terminals 75B and 75C illustrated in FIG. 13A correspond to the third ground terminals 35A and 35B according to the first embodiment.

Fifth Embodiment

Figure 14A:
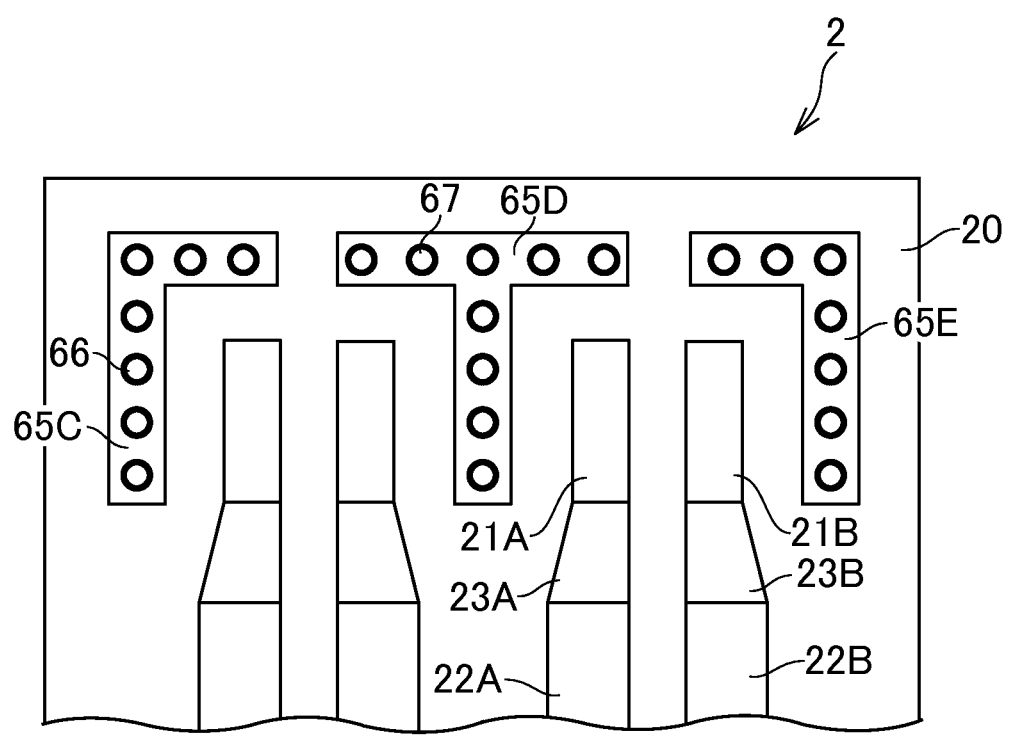
FIG. 14A is a plan view of a printed circuit board end part according to a fifth embodiment of the present invention.
Figure 14B:
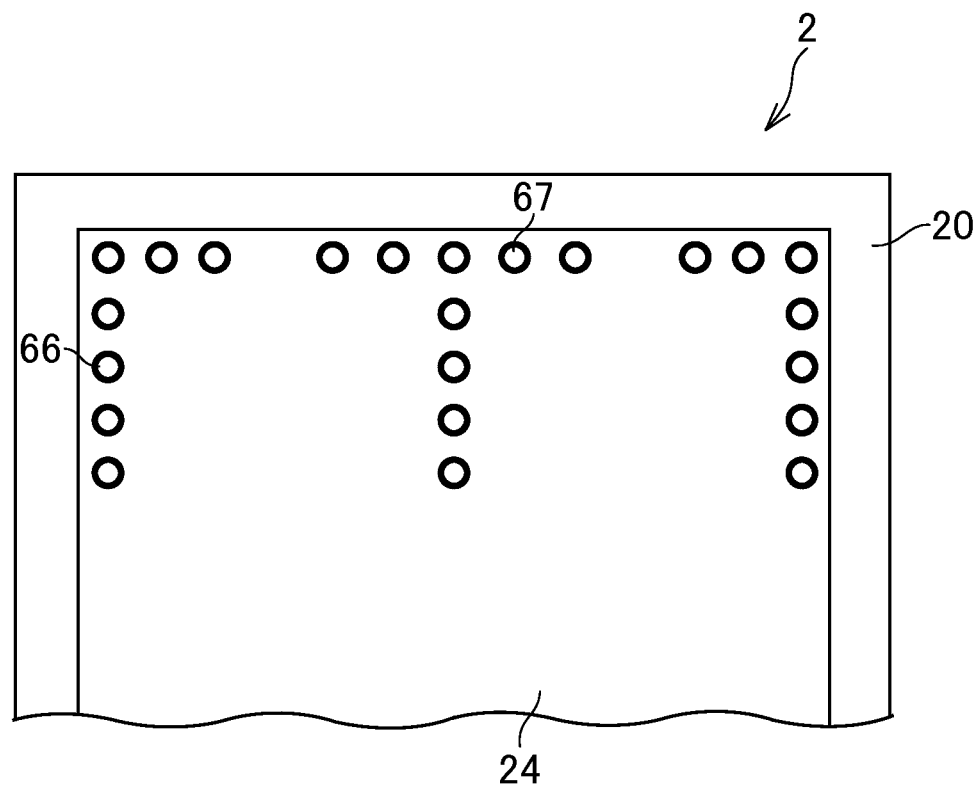
FIG. 14B is a bottom view of the printed circuit board end part according to the fifth embodiment of the present invention.

FIG. 14A and FIG. 14B are respectively a plan view and a bottom view of a printed circuit board 2 (first circuit board) according to a fifth embodiment of the present invention. The shape of the first ground terminal part according to this embodiment is different from the shape of the first ground terminal part according to the fourth embodiment. As a result, the arrangement of the via holes (first through ground conductors) is different, but the other configurations are the same as those of the fourth embodiment.

As illustrated in FIG. 14A, the first ground terminal part according to this embodiment includes first ground terminals 65C, 65D, and 65E. The first ground terminals 65C and 65D illustrated in FIG. 14A correspond to the first ground terminal 25 according to the first embodiment illustrated in FIG. 3A, and, similarly, the first ground terminals 65D and 65E illustrated in FIG. 14A correspond to the first ground terminal 25 according to the first embodiment illustrated in FIG. 3A. As in the fourth embodiment, the first ground terminal part is constructed with a plurality of first ground terminals separated from one another, to thereby provide the same effect as that of the fourth embodiment.

A description has been given of the optical transceiver module 100, the printed circuit board 2, and the flexible printed circuit board 11 according to the embodiments of the present invention. The present invention is not limited to the above-mentioned embodiments, and is widely applicable. All the shapes of the signal terminals according to the embodiments are rectangular, but the shapes are not limited to the rectangle. The signal terminal only needs to have a shape extending in the second direction (simply, an elongated shape). Even in this case, the boundary between the first and second regions and the fourth region (fifth region) only needs to be the distal end of the signal terminal part including one or more signal terminals in the second direction (the position closest to the second signal wire side (first signal wire side) in the second direction).

According to the embodiments, although not illustrated for the sake of simple description, a protective film such as a resist for further reducing the reflection and the radiation at the connection position may be formed in order to electrically shield, from the outside, the first signal wire and the first ground conductor layer formed on both surfaces of the first dielectric layer 20 of the printed circuit board 2. Similarly, a protective film such as a resist and a cover lay may be formed in order to electrically shield, from the outside, the second signal wire and the second ground conductor layer formed on both surfaces of the second dielectric layer 30 of the flexible printed circuit board 11. In any case, the protective film is not formed on the first signal terminal part and the first ground terminal part formed on the front surface of the first circuit board, and the first signal terminal part and the first ground terminal part are exposed. The same holds true for the second signal terminal part and the second ground terminal part formed on the back surface of the second circuit board.

The first circuit board according to the present invention only needs to include the first signal terminal part and the first ground terminal part formed on the front surface of the first circuit board, and may be, for example, a printed circuit board having a multi-layer structure in which a plurality of ground conductor layers are laminated via dielectric layers. Even in this case, in terms of the reduction in the reflection and the radiation at the connection position, it is desired that the signal wire be formed on the front surface of the first circuit board, and thus, it is desired that the first dielectric layer be the uppermost layer out of the plurality of dielectric layers included in the multi-layer structure. However, the configuration is not limited to this case, and the first dielectric layer may be any of the dielectric layers of the multi-layer structure. In any case, the first signal wire and the first ground conductor layer formed on the first dielectric layer only need to be respectively electrically connected to the first signal terminal part and the first ground terminal part formed on the front surface of the first circuit board. The same holds true for the second circuit board. The second signal wire and the second ground conductor layer formed on the second dielectric layer only need to be respectively electrically connected to the second signal terminal part and the second ground terminal part formed on the back surface of the second circuit board.

As the first circuit board and the second circuit board according to the present invention, a printed circuit board and a flexible printed circuit board are optimal. However, the present invention is not limited thereto, and can be widely applied to a connection position between transmission lines. The first circuit board is not limited to the printed circuit board, and can be widely applied to circuit boards. Moreover, the second circuit board is not limited to the flexible printed circuit board, and can be widely applied to wiring circuit boards. For example, the present invention may be applied to the connection position between the ceramic circuit board 12 (first circuit board) and the flexible printed circuit board 11 illustrated in FIG. 2. Moreover, both the first and second circuit boards may be wiring circuit boards such as flexible printed circuit boards. Further, the effect of the present invention is provided also for the first or second circuit board alone. Note that, in the specification, for the sake of simple description, one of the two surfaces of the dielectric layer in the microstrip line on which the signal wire (conductive strip) is formed is conventionally considered as the front surface (top surface), and the other surface on which the ground conductor layer is formed is considered as the back surface (bottom surface). Thus, for the sake of convenience, one of the two surfaces of the first circuit board on which the signal wire is formed is considered as the front surface, and one of the two surfaces of the second circuit board on which the ground conductor layer is formed is considered as the back surface. More strictly, independently of the definition of "front" and "back", one of the two surfaces of the first circuit board which is opposed to the second circuit board may be considered as a first surface, and the other surface opposite to the first surface may be considered as a second surface. The same holds true for the second circuit board.

The optical module according to the embodiments is described as an optical receiver module, and the optical transceiver module 100 according to the embodiments is described as an optical transceiver module including the optical receiver module according to the embodiments and a publicly known optical transmitter module, but the present invention is not limited thereto. The optical module according to the present invention may be an optical transmitter and an optical receiver alone. The optical transceiver module according to the present invention may include the optical transmitter module according to the present invention and a publicly known optical receiver module, or may include both the optical transmitter module according to the present invention and the optical receiver module according to the present invention.

While there have been described what are at present considered to be certain embodiments of the invention, it will be understood that various modifications may be made thereto, and it is intended that the appended claims cover all such modifications as fall within the true spirit and scope of the invention.

What is claimed is:
1. An optical module, comprising:
a first circuit board comprising:
  a first signal terminal part and a first ground terminal part, which are formed on a front surface of the first circuit board;
  a first dielectric layer;
  a first signal wire formed on a front surface of the first dielectric layer, and electrically connected to the first signal terminal part;
  a first ground conductor layer formed on aback surface of the first dielectric layer so as to include a region opposed to the first signal wire and regions extending toward both sides of the opposed region; and
  a first through ground conductor, which passes through the first dielectric layer from the back surface to the front surface, and electrically connects the first ground conductor layer and the first ground terminal part to each other; and
a second circuit board comprising a second signal terminal part and a second ground terminal part, which are respectively connected to the first signal terminal part and the first ground terminal part in an overlapping manner, and are formed on a back surface of the second circuit board,
wherein the first ground terminal part is formed, in a plan view, in a first region and a second region respectively located on both opposing sides of the first signal terminal part in a first direction, and in a third region prescribed at a location beyond the first signal terminal part in a second direction intersecting the first direction.

2. The optical module according to claim 1, wherein the regions in which the first ground terminal part is formed comprise, in a plan view, a fourth region located on an opposite side of the first signal wire across the first signal terminal part in the third region.

3. The optical module according to claim 1, wherein the first ground conductor layer is formed, in a plan view, in a region including the first ground terminal part.

4. The optical module according to claim 1, wherein the first through ground conductor is formed, in a plan view, in a region in which the first ground terminal part is formed.

5. The optical module according to claim 1, wherein the first through ground conductor is formed, in a plan view, in the first region, the second region, and the third region.

6. The optical module according to claim 1,
wherein the first signal wire comprises a single strip conductor, and
wherein the first signal terminal part comprises one terminal connected to the single strip conductor and extending in the second direction.

7. The optical module according to claim 1,
wherein the first signal wire comprises a plurality of strip conductors arranged in the first direction, and
wherein the first signal terminal part comprises a plurality of terminals respectively connected to the plurality of strip conductors, arranged in the first direction, and each extending in the second direction.

8. The optical module according to claim 6, wherein the first ground terminal part comprises, in a plan view, parts extending in the second direction respectively on both sides of the first signal terminal part in the first direction, and a part extending in the first direction in the third region.

9. The optical module according to claim 1,
wherein the second circuit board further comprises:
a second dielectric layer;
a second signal wire formed on a front surface of the second dielectric layer, and electrically connected to the second signal terminal part;
a second ground conductor layer formed on a back surface of the second dielectric layer so as to include a region opposed to the second signal wire and regions extending toward both sides of the opposed region, the second ground conductor layer being electrically connected to the second ground terminal part; and
a second through ground conductor, which passes through the second dielectric layer from the back surface to the front surface, and is electrically connected to the second ground terminal part, and
wherein the second ground terminal part is formed, in a plan view, in the first region, the second region, and the third region.

10. The optical module according to claim 9, wherein the regions in which the second ground terminal part is formed comprise, in a plan view, the fourth region in the third region.

11. An optical module, comprising:
a first circuit board comprising a first signal terminal part and a first ground terminal part, which are formed on a front surface of the first circuit board; and
a second circuit board comprising:
a second signal terminal part and a second ground terminal part, which are respectively connected to the first signal terminal part and the first ground terminal part in an overlapping manner, and are formed on a back surface of the second circuit board;
a second dielectric layer;
a second signal wire formed on a front surface of the second dielectric layer, and electrically connected to the second signal terminal part;
a second ground conductor layer formed on a back surface of the second dielectric layer so as to include a region opposed to the second signal wire and regions extending toward both sides of the opposed region, the second ground conductor layer being electrically connected to the second ground terminal part; and
a second through ground conductor, which passes through the second dielectric layer from the back surface to the front surface, and is electrically connected to the second ground terminal part,
wherein the second ground terminal part is formed, in a plan view, in a first region and a second region respectively located on both opposing sides of the second signal terminal part in a first direction, and in a third region prescribed at a location beyond the second signal terminal part in a second direction intersecting the first direction.

12. The optical module according to claim 11, wherein the regions in which the second ground terminal part is formed comprise, in a plan view, a fifth region located on an opposite side of the second signal wire across the second signal terminal part out of the third region.

13. An optical transceiver module, comprising:
a first optical module comprising:
a first circuit board comprising:
a first signal terminal part and a first ground terminal part, which are formed on a front surface of the first circuit board;
a first dielectric layer;
a first signal wire formed on a front surface of the first dielectric layer, and electrically connected to the first signal terminal part;
a first ground conductor layer formed on a back surface of the first dielectric layer so as to include a region opposed to the first signal wire and regions extending toward both sides of the opposed region; and
a first through ground conductor, which passes through the first dielectric layer from the back surface to the front surface, and electrically connects the first ground conductor layer and the first ground terminal part to each other; and
a second circuit board comprising a second signal terminal part and a second ground terminal part, which are respectively connected to the first signal terminal part and the first ground terminal part in an overlapping manner, and are formed on a back surface of the second circuit board; and
a second optical module,
wherein the first ground terminal part is formed, in a plan view, in a first region and a second region respectively located on both opposing sides of the first signal terminal part in a first direction, and in a third region prescribed at a location beyond the first signal terminal part in a second direction intersecting the first direction, and
wherein one of the first optical module and the second optical module serves as an optical transmitter, and another one of the first optical module and the second optical module serves as an optical receiver.

14. A printed circuit board, comprising:
a first signal terminal part and a first ground terminal part, which are formed on a front surface of the printed circuit board, and are respectively connected to a second signal terminal part and a second ground terminal part, which are formed on a back surface of another circuit board, in an overlapping manner;

a first dielectric layer;

a first signal wire formed on a front surface of the first dielectric layer, and electrically connected to the first signal terminal part;

a first ground conductor layer formed on a back surface of the first dielectric layer so as to include a region opposed to the first signal wire and regions extending toward both sides of the opposed region; and a first through ground conductor, which passes through the first dielectric layer from the back surface to the front surface, and electrically connects the first ground conductor layer and the first ground terminal part to each other, wherein the first ground terminal part is formed, in a plan view, in a first region and a second region respectively located on both opposing sides of the first signal terminal part in a first direction, and in a third region, which is prescribed at a location beyond the first signal terminal part in a second direction intersecting the first direction and is located on an opposite side of the first signal wire across the first signal terminal part.

15. A flexible printed circuit board, comprising:

a second signal terminal part and a second ground terminal part, which are formed on a back surface of the flexible printed circuit board, and are respectively connected to a first signal terminal part and a first ground terminal part, which are formed on a front surface of another circuit board, in an overlapping manner;

a second dielectric layer;

a second signal wire formed on a front surface of the second dielectric layer, and electrically connected to the second signal terminal part;

a second ground conductor layer formed on a back surface of the second dielectric layer so as to include a region opposed to the second signal wire and regions extending toward both sides of the opposed region, the second ground conductor layer being electrically connected to the second ground terminal part; and a second through ground conductor, which passes through the second dielectric layer from the back surface to the front surface, and is electrically connected to the second ground terminal part, wherein the second ground terminal part is formed, in a plan view, in a first region and a second region respectively located on both opposing sides of the second signal terminal part in a first direction, and in a third region prescribed at a location beyond the second signal terminal part in a second direction intersecting the first direction.

* * * * *